(12) United States Patent
Okuno et al.

(10) Patent No.: US 8,349,704 B2
(45) Date of Patent: Jan. 8, 2013

(54) METHOD FOR MANUFACTURING SOI SUBSTRATE AND SOI SUBSTRATE

(75) Inventors: Naoki Okuno, Sagamihara (JP); Akihisa Shimomura, Atsugi (JP); Hajime Tokunaga, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 120 days.

(21) Appl. No.: 12/821,545

(22) Filed: Jun. 23, 2010

(65) Prior Publication Data
US 2010/0330779 A1    Dec. 30, 2010

(30) Foreign Application Priority Data
Jun. 26, 2009    (JP) .................................. 2009-152598

(51) Int. Cl.
*H01L 21/762* (2006.01)
(52) U.S. Cl. ................. 438/458; 257/E21.568
(58) Field of Classification Search .................. None
See application file for complete search history.

(56) References Cited

U.S. PATENT DOCUMENTS

| 5,374,564 | A | 12/1994 | Bruel |
| 6,191,007 | B1 | 2/2001 | Matsui et al. |
| 6,380,019 | B1 | 4/2002 | Yu et al. |
| 6,380,046 | B1 | 4/2002 | Yamazaki |
| 7,199,024 | B2 | 4/2007 | Yamazaki |
| 7,943,487 | B2* | 5/2011 | Makino .......................... 438/458 |
| 8,043,938 | B2* | 10/2011 | Okuno .......................... 438/458 |
| 2002/0109144 | A1 | 8/2002 | Yamazaki |
| 2007/0134891 | A1 | 6/2007 | Adetutu et al. |
| 2007/0173000 | A1 | 7/2007 | Yamazaki |
| 2008/0242051 | A1 | 10/2008 | Yamazaki et al. |
| 2010/0081252 | A1 | 4/2010 | Makino |
| 2010/0120226 | A1 | 5/2010 | Yamazaki et al. |
| 2011/0124179 | A1 | 5/2011 | Tokunaga et al. |

FOREIGN PATENT DOCUMENTS

| JP | 05-211128 | 8/1993 |
| JP | 11-045862 | 2/1999 |
| JP | 2005-252244 | 9/2005 |

* cited by examiner

*Primary Examiner* — Seahvosh Nikmanesh
(74) *Attorney, Agent, or Firm* — Eric J. Robinson; Robinson Intellectual Property Law Office, P.C.

(57) ABSTRACT

A bond substrate is irradiated with accelerated ions to form an embrittled region in the bond substrate; an insulating layer is formed over a surface of the bond substrate or a base substrate; the bond substrate and the base substrate are bonded to each other with the insulating layer interposed therebetween; a region in which the bond substrate and the base substrate are not bonded to each other and which is closed by the bond substrate and the base substrate is formed in parts of the bond substrate and the base substrate; the bond substrate is separated at the embrittled region by heat treatment; and a semiconductor layer is formed over the base substrate.

40 Claims, 28 Drawing Sheets

FIG. 1A
FIG. 1B
FIG. 1C
FIG. 1D
FIG. 1E
FIG. 1F
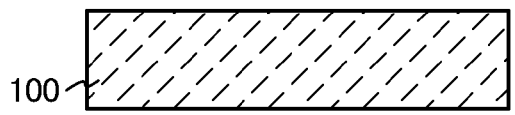
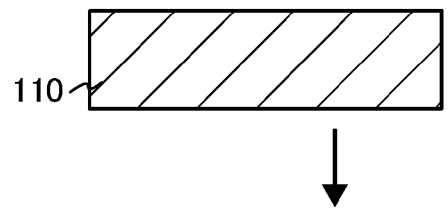
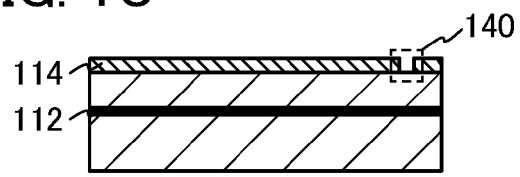
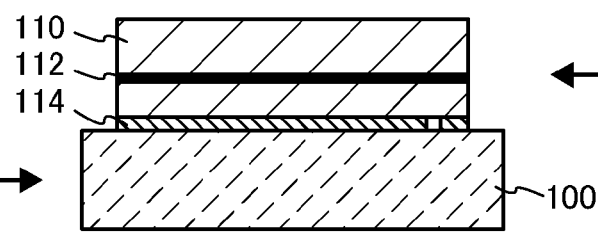
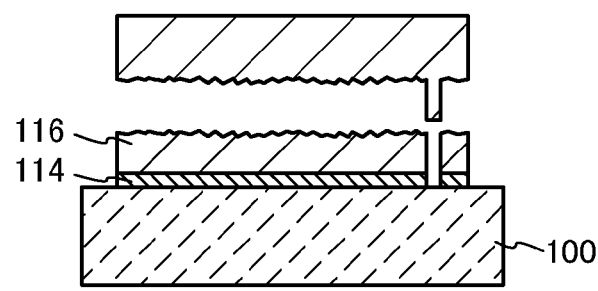
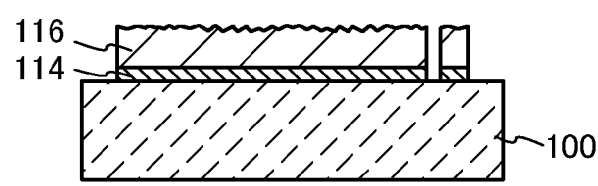

FIG. 8A
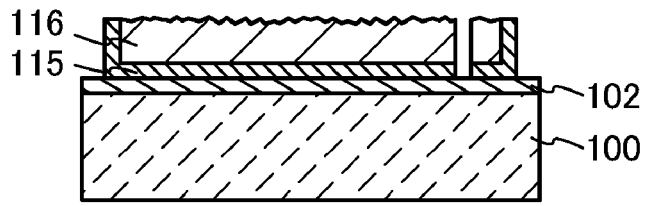
FIG. 8B
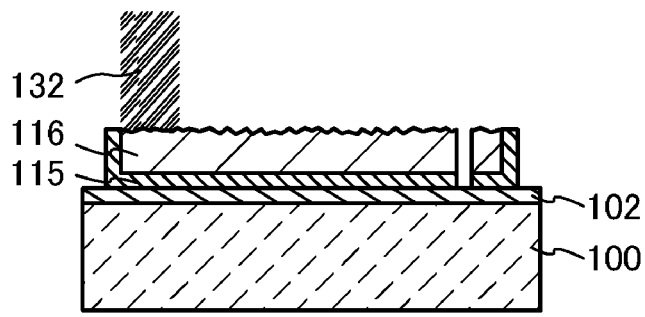
FIG. 8C
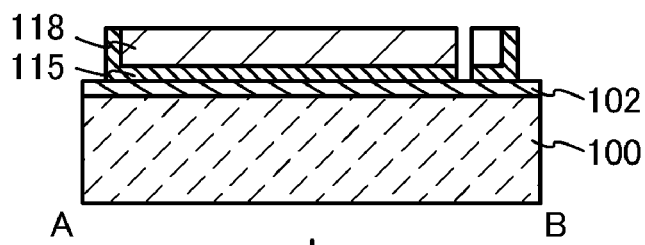
FIG. 8D
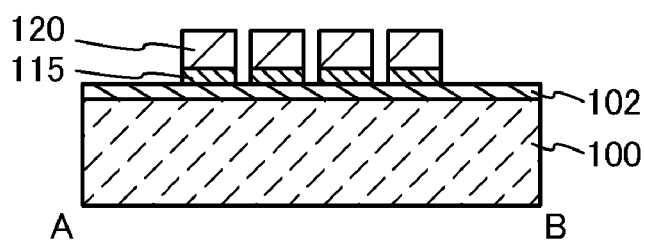

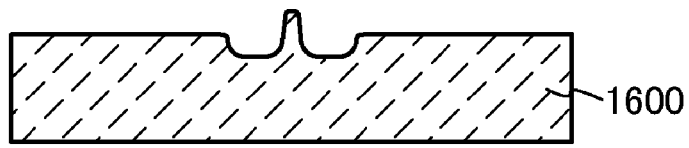
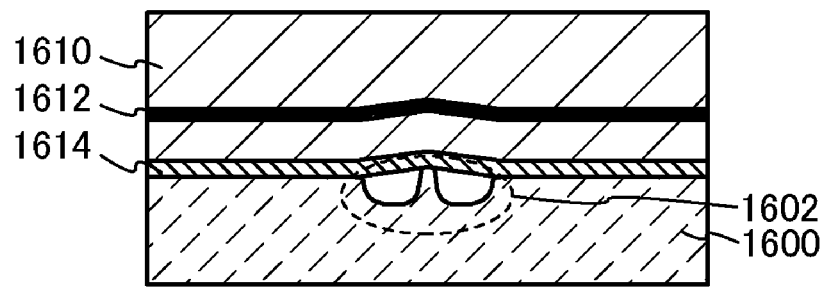
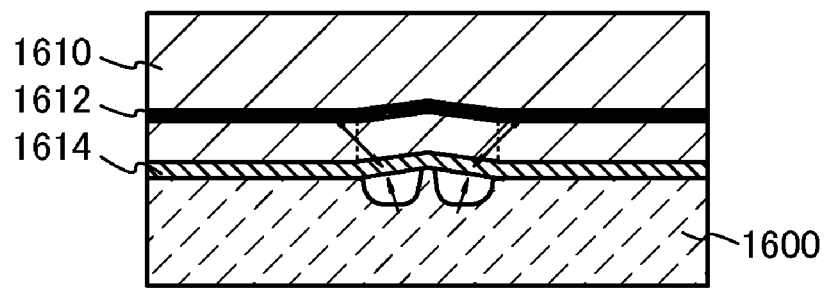
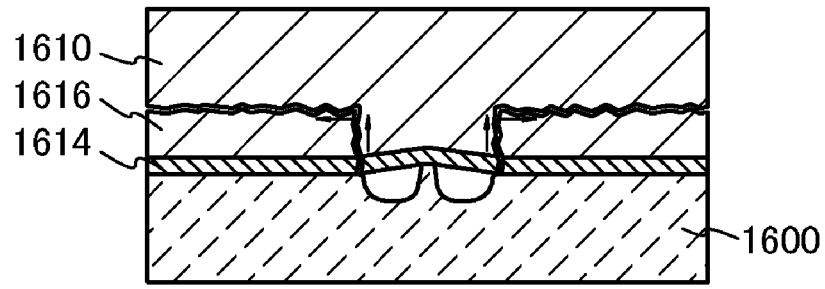

| sample No. & diameters of closed regions (mm) | detection number (detects/cm$^2$) |
|---|---|
| No.1(0mm) | 114.13 |
| No.2(0mm) | 100.35 |
| No.3(1mm) | 29.18 |
| No.4(1mm) | 28.58 |
| No.5(3mm) | 11.62 |
| No.6(4mm) | 16.32 |
| No.7(5mm) | 6.96 |
| No.8(7mm) | 7.08 |
| No.9(7mm) | 5.68 |
| No.10(8mm) | 4.56 |
| No.11(8mm) | 3.5 |

| sample No. & diameter of closed | detection number (detects/cm$^2$) |
|---|---|
| No.1 (without the closed region) | 11.2 |
| No.2 (with the closed region) | 0.38 |
| No.3 (with the closed region) | 0.4 |

METHOD FOR MANUFACTURING SOI SUBSTRATE AND SOI SUBSTRATE

BACKGROUND OF THE INVENTION

1. Field of the Invention

The present invention relates to a method for manufacturing a silicon-on-insulator (SOI) substrate, an SOI substrate, and a method for manufacturing a semiconductor device including the SOI substrate.

2. Description of the Related Art

In recent years, instead of a bulk silicon wafer, the use of a silicon-on-insulator (SOI) substrate where a thin single crystal semiconductor layer is provided over an insulating surface has been considered. Because parasitic capacitance generated by a drain of a transistor and a substrate can be reduced by use of an SOI substrate, SOI substrates have attracted great attention as substrates which improve performance of semiconductor integrated circuits.

One of known methods for manufacturing SOI substrates is a Smart Cut (registered trademark) method (for example, see Patent Document 1). A summary of a method for manufacturing an SOI substrate by a Smart Cut method is described below. First, hydrogen ions are implanted into a silicon wafer by an ion implantation method; thus, a microbubble layer is formed at a predetermined depth from the surface. Next, the silicon wafer into which hydrogen ions are implanted is bonded to another silicon wafer with a silicon oxide film interposed therebetween. After that, through heat treatment, part of the silicon wafer into which hydrogen ions are implanted is separated in a thin film shape along the microbubble layer. Accordingly, a single crystal silicon film is formed over the other bonded silicon wafer.

Further, a method for forming a single crystal silicon layer over a base substrate made of glass by using such a Smart Cut method has been proposed (for example, see Patent Document 2). Glass substrates may have larger sizes and are less expensive than silicon wafers; thus, glass substrates are mainly used in manufacturing liquid crystal display devices and the like. By using a glass substrate as a base substrate, a large-sized inexpensive SOI substrate can be manufactured.

REFERENCES

Patent Documents

[Patent Document 1] Japanese Published Patent Application No. H05-211128
[Patent Document 2] Japanese Published Patent Application No. 2005-252244

SUMMARY OF THE INVENTION

When a single crystal silicon layer is formed over a glass substrate by the Smart Cut method or the like, roughness on a surface of a silicon wafer tends to increase as compared to the case where an SOI substrate is manufactured by bonding silicon wafers to each other. Such a roughness on a surface causes various defects in a later step, which leads to reduction in the manufacturing yield of semiconductor elements and semiconductor devices as a result.

In view of the above problems, it is an object of an embodiment of the disclosed invention to suppress generation of roughness on a surface of a semiconductor layer (for example, a single crystal silicon layer) in manufacturing an SOI substrate by bonding a base substrate (for example, a glass substrate) and a bond substrate (for example, a single crystal silicon substrate) to each other. In addition, it is another object to provide a semiconductor device with high manufacturing yield by suppressing generation of the roughness.

According to an embodiment of the disclosed invention, a region where bonding is not performed and which is closed (also referred to as a region where gas is trapped) is formed in part (particularly, the periphery) of the surface which is to be bonded, in manufacturing an SOI substrate through the bonding. More specific description is given below.

An embodiment of the disclosed invention is a method for manufacturing an SOI substrate including the steps of: forming an embrittled region in a bond substrate by irradiating the bond substrate with accelerated ions; forming an insulating layer over a surface of the bond substrate or a surface of a base substrate; bonding the bond substrate and the base substrate to each other with the insulating layer interposed therebetween; forming a region in which the bond substrate and the base substrate are not bonded to each other and which is closed by the bond substrate and the base substrate in parts of the bond substrate and the base substrate; separating the bond substrate at the embrittled region by heat treatment; and forming a semiconductor layer over the base substrate.

Note that the above method can also be described as follows. That is, a method for manufacturing an SOI substrate includes the steps of: forming an embrittled region in a bond substrate by irradiating the bond substrate with accelerated ions; forming an insulating layer over a surface of the bond substrate or a surface of a base substrate; bonding the bond substrate and the base substrate to each other with the insulating layer interposed therebetween such that a space sandwiched between the bond substrate and the base substrate is formed in a portion which is peripheral to the bond substrate and the base substrate and which is an inner region not reaching an edge; separating the bond substrate by generating a crack in the embrittled region from a region where the space is formed by heat treatment; and forming a semiconductor layer over the base substrate.

It is desirable that heat treatment be performed to generate a stress in the proximity of the region in the bond substrate, where bonding is not performed and which is closed, and thus separation of the bond substrate is desirably promoted in the above method. Moreover, the region where bonding is not performed and which is closed is desirably formed by placing a projected portion or a recessed portion at the bond substrate or the base substrate. Alternatively, the region where bonding is not performed and which is closed is desirably formed by placing a projected and recessed portion at the bond substrate or the base substrate. In addition, the area of the region where bonding is not performed and which is closed is 1.0 mm$^2$ or more, desirably, 25 mm$^2$ or more.

The region where bonding is not performed and which is closed is desirably formed by placing a projected and recessed portion at the bond substrate or the base substrate in the above method. The region where bonding is not performed and which is closed is desirably formed in a corner of the bond substrate. The bonding of the bond substrate and the base substrate desirably proceeds from the corner of the bond substrate. The semiconductor layer is desirably subjected to laser light irradiation treatment. The temperature of the heat treatment is desirably 500° C. or lower.

With the use of the above manufacturing method, an SOI substrate where the number density of defects (in particular, defects each having a size of 1 μm or longer in diameter) of the semiconductor layer is 5 defects/cm$^2$ or less (for example, 1 defect/cm$^2$ or less) can be provided. In addition, a semiconductor device can be manufacturing using the SOI substrate.

In general, the term "SOI substrate" means a semiconductor substrate where a silicon semiconductor layer is provided over an insulating surface. In this specification and the like, the term "SOI substrate" also includes a semiconductor substrate where a semiconductor layer formed using a material other than silicon is provided over an insulating surface in its category. That is, a semiconductor layer included in the "SOI substrate" is not limited to a silicon semiconductor layer. In addition, in this specification and the like, a semiconductor substrate means not only a substrate formed using only a semiconductor material but also all substrates including a semiconductor material. Namely, in this specification and the like, the "SOI substrate" is also included in the category of a semiconductor substrate.

Note that in this specification and the like, the term "single crystal" means a crystal in which, when a certain crystal axis is focused, the direction of the crystal axis is oriented in a similar direction in any portion of a sample. That is, the single crystal includes a crystal in which the direction of crystal axes is uniform as described above even when it includes a crystal defect or a dangling bond.

Further, in this specification and the like, the term "semiconductor device" means all devices which can operate by utilizing semiconductor characteristics. For example, a display device and an integrated circuit are included in the category of the semiconductor device. Furthermore, in this specification and the like, the display device includes a light emitting display device, a liquid crystal display device, and a display device including an electrophoretic element. The light emitting display device includes a light emitting element, and the liquid crystal display device includes a liquid crystal element. The light emitting element includes, in its category, an element whose luminance is controlled by current or voltage, and specifically includes an inorganic electroluminescent (EL) element, an organic EL element, and the like.

According to an embodiment of the disclosed invention, a region where gas is trapped is formed in part (the periphery) of the surface to be bonded. Accordingly, an SOI substrate having a semiconductor layer where generation of the surface roughness is suppressed can be provided. In addition, the manufacturing yield of a semiconductor device including the SOI substrate can be improved.

BRIEF DESCRIPTION OF THE DRAWINGS

In the accompanying drawings:

FIGS. 1A to 1F are cross-sectional views illustrating an example of a method for manufacturing an SOI substrate;

FIGS. 8A to 8D are cross-sectional views illustrating an example of a method for manufacturing an SOI substrate;

FIGS. 14A to 14C are plan views each illustrating an example of a shape of a recessed portion and the like;

FIGS. 16A to 16D are views illustrating separation of a semiconductor layer;

DETAILED DESCRIPTION OF THE INVENTION

Figure 2A:
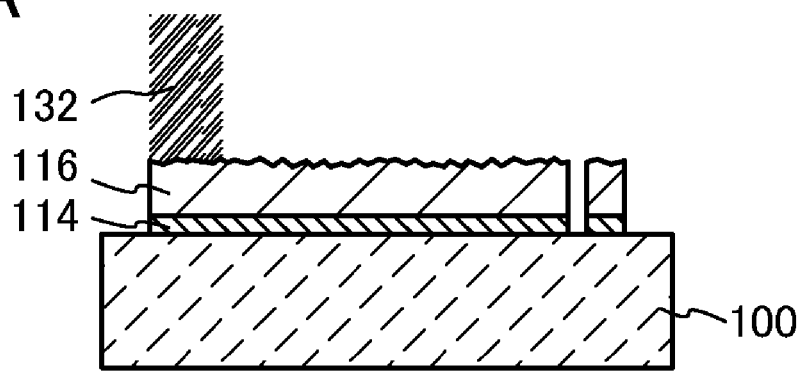
FIGS. 2A to 2C are cross-sectional views illustrating an example of a method for manufacturing an SOI substrate.

Embodiments will be described in detail below with reference to the accompanying drawings. Note that the invention is not limited to the following description of the embodiments, and it is readily appreciated by those skilled in the art that modes and details of the invention can be modified in a variety of ways without departing from the spirit and scope of the invention disclosed in this specification and the like. In addition, any of structures according to different embodiments can be combined with each other, as appropriate. Note that in the structure of the invention described below, reference numerals indicating the same portions and portions having a similar function are used in common in different drawings, and repeated descriptions thereof are omitted.

Embodiment 1

In this embodiment, an example of a method for manufacturing an SOI substrate is described with reference to drawings. Specifically, the case of manufacturing an SOI substrate where a single crystal semiconductor layer is provided over a base substrate is described.

First, a base substrate 100 and a bond substrate are prepared. Here, the case where a single crystal semiconductor substrate 110 is used as a bond substrate is described (see FIGS. 1A and 1B).

As the base substrate 100, a substrate formed using an insulator can be used. Specific examples thereof include: a variety of glass substrates used in the electronic industries, such as substrates formed using aluminosilicate glass, aluminoborosilicate glass, and barium borosilicate glass; a quartz substrate; a ceramic substrate; and a sapphire substrate. Note that when the glass substrate contains a larger amount of barium oxide (BaO) than boric acid ($B_2O_3$), more-practical heat-resistant glass can be obtained. Therefore, it is preferable that a glass substrate containing more BaO than $B_2O_3$ be used when the glass substrate needs to have heat resistance. Note that in this embodiment, the case where a glass substrate is used as the base substrate 100 is described. When a glass substrate which can have a larger size and is inexpensive is used as the base substrate 100, a cost reduction can be achieved.

Alternatively, as the base substrate 100, a semiconductor substrate such as a single crystal silicon substrate or a single crystal germanium substrate can be used. In the case where a semiconductor substrate is used as the base substrate 100, an SOI substrate with high quality can be easily obtained because the temperature condition for heat treatment is eased as compared to the case where a glass substrate or the like is used. Here, as a semiconductor substrate, a solar grade silicon (SOG-Si) substrate or the like may be used. Alternatively, a polycrystalline semiconductor substrate may be used. When a solar grade silicon substrate, a polycrystalline semiconductor substrate, or the like is used, manufacturing costs can be suppressed as compared to the case where a single crystal silicon substrate or the like is used.

Note that an embodiment of the disclosed invention is to suppress generation of surface roughness of a semiconductor layer, which arises from a difference in material between substrates to be bonded, and thus is effective in the case where materials or the like of substrates to be bonded are different. Even in the case where substrates made from the same material are bonded to each other, a sufficient advantageous effect can be obtained in terms of suppression of generation of surface roughness.

A surface of the base substrate 100 is preferably cleaned in advance. Specifically, the base substrate 100 is subjected to ultrasonic cleaning with a hydrochloric acid/hydrogen peroxide mixture (HPM), a sulfuric acid/hydrogen peroxide mixture (SPM), an ammonium hydroxide/hydrogen peroxide mixture (APM), diluted hydrofluoric acid (DHF), or the like. Through such cleaning treatment, the flatness of the surface of the base substrate 100 can be improved and abrasive particles left on the surface of the base substrate 100 can be removed.

As the single crystal semiconductor substrate 110, a single crystal semiconductor substrate formed using an element belonging to Group 14 of the periodic table, such as a single crystal silicon substrate, a single crystal germanium substrate, or a single crystal silicon germanium substrate, can be used. Alternatively, a compound semiconductor substrate using gallium arsenide, indium phosphide, or the like can be used. Typical commercially available silicon substrates are circular silicon substrates which are 5 inches (125 mm) in diameter, 6 inches (150 mm) in diameter, 8 inches (200 mm) in diameter, 12 inches (300 mm) in diameter, and 16 inches (400 mm) in diameter. Note that the shape of the single crystal semiconductor substrate 110 is not limited to a circular shape and a single crystal semiconductor substrate which is processed into a rectangular shape can also be used. Alternatively, the single crystal semiconductor substrate 110 can be manufactured by a CZ method or a floating zone (FZ) method.

In view of removal of contaminants, it is preferable that a surface of the single crystal semiconductor substrate 110 be cleaned with a sulfuric acid/hydrogen peroxide mixture (SPM), an ammonium hydroxide/hydrogen peroxide mixture (APM), a hydrochloric acid/hydrogen peroxide mixture (HPM), diluted hydrofluoric acid (DHF), or the like. Alternatively, diluted hydrofluoric acid and ozone water may be discharged alternately to clean the surface of the single crystal semiconductor substrate 110.

Note that in this embodiment, the case of using a single crystal semiconductor substrate as a bond substrate is described; however, an embodiment of the disclosed invention should not be construed as being limited to this structure. For example, as a bond substrate, a polycrystalline semiconductor substrate or the like may be used.

Next, an embrittled region 112 is formed in the single crystal semiconductor substrate 110 at a predetermined depth from the surface, and then the base substrate 100 and the single crystal semiconductor substrate 110 are bonded to each other with an insulating layer 114 interposed therebetween (see FIGS. 1C and 1D).

In this embodiment, a recessed portion 140 is formed in a region of a surface of the insulating layer 114, the region corresponding to the periphery of the single crystal semiconductor substrate 110, so that a region where the base substrate 100 and the single crystal semiconductor substrate 110 are not bonded to each other and which is closed by the base substrate 100 and the single crystal semiconductor substrate 110 (for example, a region where gas is trapped) (see FIG. 1C). In such a manner, a region where bonding is not performed and which is closed (hereinafter simply referred to as a "closed region") is formed in part of a surface to be bonded. Thus, a trigger for separation can be effectively obtained. Accordingly, generation of roughness on the surface of the single crystal semiconductor substrate to be formed can be suppressed.

Note that although the recessed portion 140 is formed in the insulating layer 114 in this embodiment; however, an embodiment of the disclosed invention should not be construed as being limited to this structure. A projected portion may be formed instead of the recessed portion. It is needless to say that a projected and recessed portion may be formed by combining a projected portion and a recessed portion. In an embodiment of the disclosed invention, the closed region (the region where gas is trapped) is formed so that generation of roughness on a surface of a semiconductor layer can be suppressed. Accordingly, if the technical idea is realized, the specific structure and embodiment do not need to be construed as being limited to the particular structure.

As the method for forming the recessed portion, patterning after the formation of the insulating layer 114, marking by laser light irradiation or the like, marking with a glass pen, or the like can be employed. As the method for forming the projected portion, patterning after the formation of the insulating layer 114, marking by laser light irradiation or the like, marking with a glass pen, attachment of a particle with an appropriate size on the surface of the insulating layer 114, or the like can be employed. For example, when identification numbers are given to a substrate (or a semiconductor device), printing is performed with a laser marker in some cases. It is preferable that the closed region be formed by utilizing this because a semiconductor layer where generation of surface roughness is suppressed can be obtained without increase in manufacturing costs.

Moreover, the projected portion or the recessed portion does not need to be formed as long as the closed region can be formed. For example, the closed region can also be formed by controlling a stress (pressure) during bonding. In this case, the stress during bonding is desirably 20 N/cm² or more. When the stress during bonding is set to 20N/cm² or more, the closed region can be formed suitably.

Note that the area of the closed region is desirably 1 mm³ or more, more desirably 25 mm³ or more. Accordingly, generation of roughness on a surface of a semiconductor layer to be formed can be suppressed effectively.

Note that in this embodiment, the closed region is formed in the region corresponding to the periphery of the single crystal semiconductor substrate; however, the invention is not limited to this structure. When the closed region is formed in the region corresponding to the periphery of the single crystal semiconductor substrate, the closed region may be formed in one portion at a corner of the single crystal semiconductor substrate. In such a manner, the closed region is formed in one portion at a corner and bonding proceeds from the corners, whereby the effect of suppressing generation of roughness on a surface of a semiconductor layer can be more improved.

The embrittled region 112 can be formed in the single crystal semiconductor substrate 110 at a predetermined depth from the surface by irradiating the single crystal semiconductor substrate 110 with ions of hydrogen or the like having kinetic energy.

The depth at which the embrittled region 112 is formed can be controlled by the kinetic energy, mass, charge, or incidence angle of the ions, or the like. The embrittled region 112 is formed at approximately the same depth as the average penetration depth of the ions. Therefore, the thickness of a single crystal semiconductor layer to be separated from the single crystal semiconductor substrate 110 can be controlled by the depth at which the ions are added. For example, the average penetration depth may be controlled such that the thickness of the single crystal semiconductor layer is approximately greater than or equal to 10 nm and less than or equal to 500 nm, preferably, greater than or equal to 50 nm and less than or equal to 200 nm.

The ion irradiation treatment can be performed with an ion-doping apparatus or an ion-implantation apparatus. As a typical example of the ion-doping apparatus, there is a non-mass-separation type apparatus in which plasma excitation of a process gas is performed and an object to be processed is irradiated with all kinds of generated ion species. In the apparatus, the object to be processed is irradiated with ion species of plasma without mass separation. In contrast, the ion-implantation apparatus is a mass-separation type apparatus. In the ion-implantation apparatus, mass separation of ion species of plasma is performed and the object to be processed is irradiated with ion species having predetermined masses.

In this embodiment, an example is described in which an ion-doping apparatus is used to add hydrogen to the single crystal semiconductor substrate 110. A gas containing hydrogen is used as a source gas. As for ions used for the irradiation, the proportion of $H_3^+$ is preferably set high. Specifically, it is preferable that the proportion of $H_3^+$ be set 50% or higher (more preferably, 80% or higher) with respect to the total amount of $H^+$, $H_2^+$, and $H_3^+$. With a high proportion of $H_3^+$, the efficiency of ion irradiation can be improved.

Note that ions to be added are not limited to hydrogen. Ions of helium or the like may be added. Moreover, the kind of ions to be added is not limited to one kind, and plural kinds of ions may be added. For example, in the case where irradiation with hydrogen and irradiation with helium are performed with an ion-doping apparatus at the same time, the number of steps can be reduced as compared to the case where irradiation with hydrogen and helium is separately performed, and generation of roughness on a surface of a single crystal semiconductor layer to be formed in a later step can be more suppressed.

Further, the insulating layer 114 can be formed using a single layer or a stacked layer of insulating layers such as a silicon oxide film, a silicon oxynitride film, a silicon nitride film, or a silicon nitride oxide film. These films can be formed by a thermal oxidation method, a CVD method, a sputtering method, or the like.

Note that in this specification and the like, the term "oxynitride" means a substance which contains oxygen and nitrogen so that the content (the number of atoms) of oxygen is higher (larger) than that of nitrogen. For example, a silicon oxynitride is a substance containing oxygen, nitrogen, silicon, and hydrogen in ranges of 50 at. % to 70 at. %, 0.5 at. % to 15 at. %, 25 at. % to 35 at. %, and 0.1 at. % to 10 at. %, respectively. Further, the term "nitride oxide" means a substance which contains oxygen and nitrogen so that the content (the number of atoms) of nitrogen is higher (larger) than that of oxygen. For example, a silicon nitride oxide is a substance containing oxygen, nitrogen, silicon, and hydrogen in ranges of 5 at. % to 30 at. %, 20 at. % to 55 at. %, 25 at. % to 35 at. %, and 10 at. % to 30 at. %, respectively. Note that the above ranges are obtained by measurement using Rutherford backscattering spectrometry (RBS) or hydrogen forward scattering (HFS). Moreover, the total of the percentages of the constituent elements does not exceed 100 at. %.

Bonding is performed such that the base substrate 100 and the single crystal semiconductor substrate 110 are disposed in close contact with each other with the insulating layer 114 interposed therebetween, and then a pressure of greater than or equal to 1 N/cm² and less than or equal to 500 N/cm² is applied to one portion of the base substrate 100 or the single crystal semiconductor substrate 110 (see FIG. 1D). A bonding between the base substrate 100 and the insulating layer 114 is generated at the portion to which the pressure is applied and spontaneous bonding proceeds throughout the entire surface from the portion. This bonding is performed under the action of the Van der Waals force or hydrogen bonding and can be performed at room temperature. The closed region is formed through the bonding treatment.

Note that it is desirable that bonding proceed from a region which serves as the closed region. It is needless to say that a certain advantageous effect can be obtained even when bonding proceeds from a portion other than the region; however, when bonding proceeds from the region, generation of surface roughness can be more effectively suppressed.

Note that before the single crystal semiconductor substrate 110 and the base substrate 100 are bonded to each other, surfaces to be bonded to each other are preferably subjected to surface treatment. The surface treatment can improve the bonding strength at the bonding interface between the single crystal semiconductor substrate 110 and the base substrate 100.

As examples of the surface treatment, wet treatment, dry treatment, and a combination of wet treatment and dry treatment can be given. Different wet treatments or different dry treatments may be combined to be performed.

As examples of the wet treatment, ozone treatment using ozone water (ozone water cleaning), megasonic cleaning, two-fluid cleaning (method in which functional water such as pure water or hydrogenated water and a carrier gas such as nitrogen are sprayed together), and the like can be given. As examples of the dry treatment, ultraviolet treatment, ozone treatment, plasma treatment, plasma treatment with bias application, radical treatment, and the like can be given. The surface treatment on an object to be processed (a single crystal semiconductor substrate, an insulating layer formed on a single crystal semiconductor substrate, a support substrate, or an insulating layer formed on a support substrate) has an effect of improving the hydrophilicity and cleanliness of the surface of the object to be processed. As a result, the bonding strength between the substrates can be improved.

The wet treatment is effective for removal of macro dust and the like attached to the surface of the object to be processed; the dry treatment is effective for removal or decomposition of micro dust and the like such as an organic substance attached to the surface of the object to be processed. The case in which the dry treatment such as ultraviolet treatment is performed on the object to be processed and then the wet treatment such as cleaning is performed is preferable because the surface of the object to be processed can be made clean and hydrophilic and generation of a mark of water on the surface of the object can be suppressed.

As the dry treatment, it is preferable to perform surface treatment using ozone or oxygen in an active state such as singlet oxygen. Ozone or oxygen in an active state such as singlet oxygen enables organic substances attached to the surface of the object to be processed to be removed or decomposed effectively. Further, the treatment using ozone or oxygen in an active state such as singlet oxygen may be combined with treatment using ultraviolet rays having a wavelength of less than 200 nm, so that the organic substances attached to the surface of the object to be processed can be removed more effectively. Specific description thereof is given below.

For example, irradiation with ultraviolet rays under the atmosphere including oxygen is performed to perform the surface treatment of the object to be processed. By irradiation with light having a wavelength of less than 200 nm and light having a wavelength of 200 nm or more, which are ultraviolet rays, in an atmosphere including oxygen, singlet oxygen as well as ozone can be generated. Alternatively, by irradiation with light having a wavelength of less than 180 nm, which is an ultraviolet ray, singlet oxygen as well as ozone can be generated.

Examples of reactions which occur by irradiation with light having a wavelength of less than 200 nm and light having a wavelength of 200 nm or more in an atmosphere including oxygen are described.

$$O_2 + h\nu(\lambda_1 \text{ nm}) \rightarrow O(^3P) + O(^3P) \quad (1)$$

$$O(^3P) + O_2 \rightarrow O_3 \quad (2)$$

$$O_3 + h\nu(\lambda_2 \text{ nm}) \rightarrow O(^1D) + O_2 \quad (3)$$

In the above reaction formula (1), irradiation with light (hv) having a wavelength ($\lambda_1$ nm) of less than 200 nm in an atmosphere including oxygen ($O_2$) is performed to generate an oxygen atom ($O(^3P)$) in a ground state. Next, in the reaction formula (2), an oxygen atom ($O(^3P)$) in a ground state and oxygen ($O_2$) are reacted with each other to generate ozone ($O_3$). Then, in the reaction formula (3), irradiation with light having a wavelength ($\lambda_2$ nm) of 200 nm or more in an atmosphere including generated ozone ($O_3$) is performed to generate singlet oxygen $O(^1D)$ in an excited state. In an atmosphere including oxygen, irradiation with ultraviolet rays having a wavelength of less than 200 nm is performed to generate ozone, and irradiation with ultraviolet rays having a wavelength of 200 nm or more is performed to decompose ozone and generate singlet oxygen. The surface treatment as described above, for example, can be performed by irradiation with light from a low-pressure mercury lamp ($\lambda_1$=185 nm, $\lambda_2$=254 nm) in an atmosphere including oxygen.

In addition, examples of reactions which occur by irradiation with light having a wavelength of less than 180 nm in an atmosphere including oxygen are described.

$$O_2 + h\nu(\lambda_3 \text{ nm}) \rightarrow O(^1D) + O(^3P) \quad (4)$$

$$O(^3P) + O_2 \rightarrow O_3 \quad (5)$$

$$O_3 + h\nu(\lambda_3 \text{ nm}) \rightarrow O(^1D) + O_2 \quad (6)$$

In the above reaction formula (4), irradiation with light having a wavelength ($\lambda_3$ nm) of less than 180 nm in an atmosphere including oxygen ($O_2$) is performed to generate singlet oxygen $O(^1D)$ in an excited state and an oxygen atom ($O(^3P)$) in a ground state. Next, in the reaction formula (5), an oxygen atom ($O(^3P)$) in a ground state and oxygen ($O_2$) are reacted with each other to generate ozone ($O_3$). In the reaction formula (6), irradiation with light having a wavelength ($\lambda_3$ nm) of less than 180 nm in an atmosphere including generated ozone ($O_3$) is performed to generate singlet oxygen in an excited state and oxygen. In an atmosphere including oxygen, irradiation with ultraviolet rays having a wavelength of less than 180 nm is performed to generate ozone as well as to decompose ozone or oxygen and to generate singlet oxygen. The surface treatment as described above, for example, can be performed by irradiation with light from a Xe excimer UV lamp in an atmosphere including oxygen.

Chemical bonding of an organic substance or the like attached to a surface of an object to be processed is cut with light having a wavelength of less than 200 nm, whereby the organic substance attached to the surface of the object to be processed, the organic substance whose chemical bonding is cut, or the like can be removed by oxidative decomposition with ozone or singlet oxygen. By performing surface treatment as described above, the hydrophilicity and cleanliness of the surface of the object to be processed can be increased, and favorable bonding can be performed.

Note that heat treatment for increasing the bonding strength may be performed after the bonding is performed. This heat treatment is performed at a temperature at which separation at the embrittled region 112 does not occur (for example, higher than or equal to room temperature and lower than 400° C.). Alternatively, the base substrate 100 and the insulating layer 114 may be bonded to each other while being heated at a temperature within this range. The heat treatment can be performed using a heating furnace such as a diffusion furnace or a resistance heating furnace, a rapid thermal annealing (RTA) apparatus, a microwave heating apparatus, or the like. The above temperature conditions are merely an example, and an embodiment of the disclosed invention should not be construed as being limited to this example.

Next, for example, heat treatment is performed at 400° C. or higher to cause separation of the single crystal semiconductor substrate 110 at the embrittled region 112, whereby a single crystal semiconductor layer 116 is provided over the base substrate 100 with the insulating layer 114 interposed therebetween (see FIGS. 1E and 1F).

By the heat treatment, the added element is separated out into microvoids which are formed in the embrittled region 112, and the internal stress is increased. By the increased pressure, a crack is generated in the embrittled region 112, and accordingly, the single crystal semiconductor substrate 110 is separated along the embrittled region 112. Because the insulating layer 114 is bonded to the base substrate 100, the single crystal semiconductor layer 116 which is separated from the single crystal semiconductor substrate 110 remains over the base substrate 100. Note that bonding is not performed in the recessed portion 140 (or a projected portion). Therefore, the single crystal semiconductor layer 116 is not formed in a region of the base substrate 100, which corresponds to the recessed portion 140. The region serves as a trigger for separation and generation of roughness on a surface of the single crystal semiconductor layer 116 can be suppressed.

Note that it is desirable that the heat treatment temperature in the separation be as low as possible. This is because as the temperature in the separation is low, generation of roughness on the surface of the single crystal semiconductor layer 116 can be suppressed. Specifically, for example, the effective heat treatment temperature in the separation is higher than or equal to 300° C. and lower than or equal to 600° C., preferably higher than or equal to 400° C. and lower than or equal to 500° C. Note that it is confirmed that the heat treatment temperature in the separation can be kept low in the case where the closed region is formed. As an example, in the case where the closed region is not formed, even when the temperature needs to be 500° C. or higher in separation, separation can be performed at 500° C. or lower by formation of the closed region. It is considered that this is because the closed region serves as a trigger for separation, so that separation can be performed at a temperature lower than a temperature when the region does not exist. The above temperature conditions are merely an example, and an embodiment of the disclosed invention should not be construed as being limited to this example.

Moreover, there is an advantage that the timing of separation (separation temperature) can be made uniform by forming the closed region. By uniformity of the timing of separation, the change in characteristics of the substrate which is caused by surface roughness can be suppressed. Note that as for this point, it is confirmed that the temperature in separation is approximately within a range of ±1° C. with the use of a plurality of samples (four samples) each including a region which is not bonded. Note that the timing of separation is merely an example, and an embodiment of the disclosed invention should not be construed as being limited to this example.

Figure 2B:
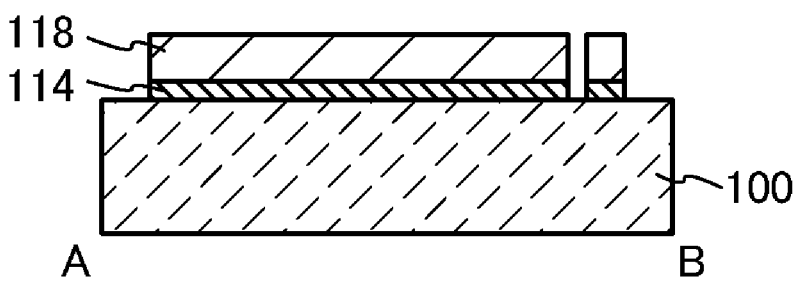
Figure 3A:
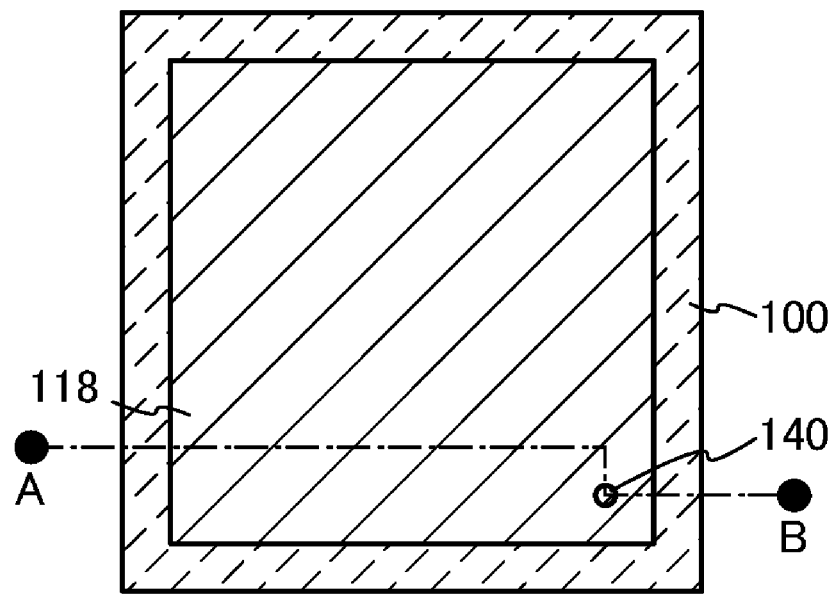
FIGS. 3A and 3B are plan views illustrating examples of methods for manufacturing an SOI substrate.

Next, the surface of the single crystal semiconductor layer 116 is irradiated with laser light 132, thereby forming a single crystal semiconductor layer 118 where the flatness of the surface is improved and the number of defects is reduced (see FIGS. 2A and 2B and FIG. 3A). FIG. 2B corresponds to a cross section taken along line A-B in FIG. 3A.

Note that it is preferable that the melting of the single crystal semiconductor layer 116 by irradiation with the laser light 132 be partial melting. This is because, if the single crystal semiconductor layer 116 is completely melted, it is microcrystallized due to disordered nucleation after being in a liquid phase, so that the crystallinity thereof decreases. On the other hand, by partial melting, crystal growth can be performed based on a non-melted solid phase portion. Therefore, crystal quality can be improved as compared to the case where the single crystal semiconductor layer 116 is completely melted. In addition, incorporation of oxygen, nitrogen, or the like from the insulating layer 114 can be suppressed. Note that the phrase "partial melting" described above means melting the single crystal semiconductor layer 116 by laser light irradiation to a depth smaller than the depth to an interface on the insulating layer 114 side (i.e., smaller than the thickness of the single crystal semiconductor layer 116). In other words, it refers to a state in which the upper portion of the single crystal semiconductor layer 116 is melted into a liquid phase whereas the lower portion is not melted and remains in a solid phase. Note that the phrase "complete melting" means that the single crystal semiconductor layer 116 is melted to the interface with the insulating layer 114 and becomes a liquid state.

For the laser light irradiation, a pulsed laser is preferably used. This is because high-energy pulsed laser light can easily produce a partially melted state. The repetition rate is preferably, but not limited to, approximately greater than or equal to 1 Hz and less than or equal to 10 MHz. Examples of the pulsed laser include an Ar laser, a Kr, laser, an excimer laser (ArF, KrF, XeCl) laser, a $CO_2$ laser, a YAG laser, a $YVO_4$ laser, a YLF laser, a $YAlO_3$ laser, a $GdVO_4$ laser, a $Y_2O_3$ laser, a ruby laser, an alexandrite laser, a Ti:sapphire laser, a copper vapor laser, a gold vapor laser, and the like. Note that a continuous-wave laser may be used if it can cause partial melting. Example of the continuous-wave laser include an Ar laser, a Kr laser, a $CO_2$ laser, a YAG laser, a $YVO_4$ laser, a YLF laser, a $YAlO_3$ laser, a $GdVO_4$ laser, a $Y_2O_3$ laser, a ruby laser, an alexandrite laser, a Ti:sapphire laser, a helium-cadmium laser, and the like.

The wavelength of the laser light 132 needs to be selected so that the laser light 132 is absorbed by the single crystal semiconductor layer 116. The wavelength may be determined in consideration of the skin depth of the laser light and the like. For example, the wavelength can be set in the range of greater than or equal to 250 nm and less than or equal to 700 nm. The energy density of the laser light 132 can be determined in consideration of the wavelength of the laser light 132, the skin depth of the laser light, the thickness of the single crystal semiconductor layer 116, or the like. The energy density of the laser light 132 may be set in the range of greater than or equal to 300 $mJ/cm^2$ and less than or equal to 800 $mJ/cm^2$, for example. Note that the above range of the energy density is an example when a XeCl excimer laser (wavelength: 308 nm) is used as the pulsed laser.

The irradiation with the laser light 132 can be performed in an atmosphere including oxygen such as an air atmosphere or in an inert atmosphere such as a nitrogen atmosphere or an argon atmosphere. In order to perform irradiation with the laser light 132 in an inert atmosphere, the irradiation with the laser light 132 may be performed in an airtight chamber while the atmosphere in the chamber is controlled. In the case where a chamber is not used, an inert atmosphere can be obtained by blowing an inert gas such as a nitrogen gas to the surface which is irradiated with the laser light 132.

Note that in an inert atmosphere such as nitrogen, the flatness of the single crystal semiconductor layer 118 can be improved more effectively than in an air atmosphere. In addition, in an inert atmosphere, generation of cracks and ridges can be suppressed more effectively than in an air atmosphere, and the applicable energy density range for the laser light 132 is wider. Note that irradiation with the laser light 132 may be performed in a reduced-pressure atmosphere. When irradiation with the laser light 132 is performed in a reduced-pressure atmosphere, the same effects as those obtained by the irradiation in an inert atmosphere can be obtained.

Note that although the irradiation treatment with the laser light 132 is performed shortly after the heat treatment for separation of the single crystal semiconductor layer 116 in this embodiment, an embodiment of the disclosed invention should not be construed as being limited thereto. After the heat treatment for separation of the single crystal semiconductor layer 116, etching treatment may be performed to remove a region including many defects at the surface of the single crystal semiconductor layer 116. Then, the irradiation treatment with the laser light 132 may be performed. Alternatively, after the flatness of the surface of the single crystal semiconductor layer 116 is improved, the irradiation treatment with the laser light 132 may be performed. Note that the etching treatment may be either wet etching or dry etching.

Although not described in this embodiment, after the irradiation with the laser light 132 is performed as described above, a step of thinning the single crystal semiconductor layer 118 may be performed. In order to thin the single crystal semiconductor layer 118, one of dry etching and wet etching or a combination of both of the etchings may be employed.

Through the above steps, an SOI substrate having an excellent semiconductor layer where generation of the surface roughness is suppressed can be obtained (see FIG. 2B and FIG. 3A).

In this embodiment, the surface of the single crystal semiconductor layer 116 is irradiated with the laser light 132, whereby the single crystal semiconductor layer 118 where the flatness of the surface is improved and the number of defects is reduced can be obtained. Here, in the case where the surface of the single crystal semiconductor layer 116 is rough before the irradiation with the laser light 132, the film quality of the single crystal semiconductor layer 118 tends to deteriorate by the irradiation with the laser light 132. For example, even in the case where there are minute defects (such as partial break of the film) in the single crystal semiconductor layer 116, those defects tend to become larger by the irradiation with the laser light 132. It is considered that this is because a semiconductor in a region peripheral to the minute defects (a region where the single crystal semiconductor layer 116 is thin) is melted by the irradiation with the laser light 132 and the region in the semiconductor is moved by surface tension or the like.

As described above, in the case where the surface of the single crystal semiconductor layer 116 is rough, defects tend to be caused by such a roughness. Therefore, it is important to suppress generation of roughness on the surface of the single crystal semiconductor layer 116. In particular, in the case where the irradiation with the laser light 132 is performed, the method for forming the closed region, which is described in this embodiment, is an extremely effective means for solution.

Figure 2C:
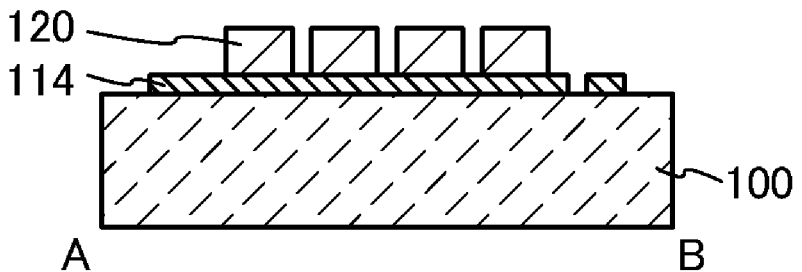
Figure 3B:
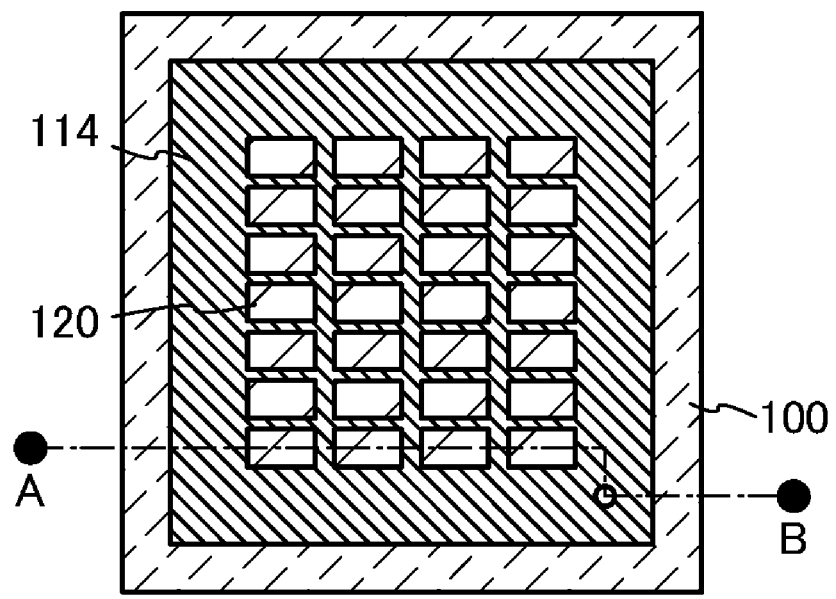

Note that after the above steps, the single crystal semiconductor layer 118 of an SOI substrate may be patterned to form an island-shaped semiconductor layer 120. In the patterning, it is desirable that the single crystal semiconductor layer 118 in the region corresponding to the periphery (in the proximity of the recessed portion 140 (or the projected portion)) be removed (see FIG. 2C and FIG. 3B). Note that FIG. 2C corresponds to a cross section taken along line A-B in FIG. 3B. Here, the reason why the single crystal semiconductor layer 118 in the region corresponding to the periphery is removed is that there increases the possibility that a region which cannot be used for a semiconductor device is caused by formation of the closed region or peeling of the semiconductor layer occurs due to the shortage of the bonding strength. Note that the shortage of the bonding strength is caused because the edge of the surface of the single crystal semiconductor substrate has a curved surface-shape (called Edge Roll-Off) resulting from surface polishing treatment.

Note that although the recessed portion (or the projected portion) is formed in one portion at a corner of the single crystal semiconductor layer in this embodiment (see FIG. 3A or the like), an embodiment of the disclosed invention is not limited to this structure. The number and position of the closed regions may be determined as appropriate. Note that in consideration of improvement in the manufacturing yield of semiconductor devices in a later step, it is desirable that the closed region be formed in the region to be removed in a later step (see FIG. 3B); however, an embodiment of the disclosed invention should not be construed as being limited to this structure.

The structure described in this embodiment can be used in appropriate combination with any of structures described in the other embodiments.

Embodiment 2

In this embodiment, another example of a method for manufacturing an SOI substrate is described with reference to drawings.

Figure 4A:
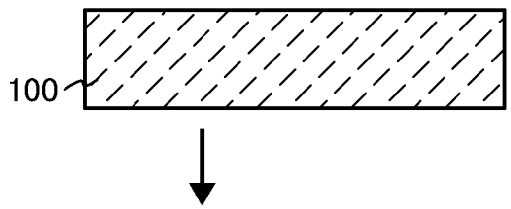
FIGS. 4A to 4G are cross-sectional views illustrating an example of a method for manufacturing an SOI substrate.
Figure 4C:
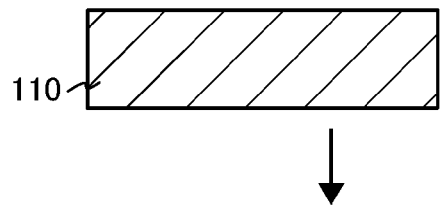

First, the base substrate 100 and the single crystal semiconductor substrate 110 as a bond substrate are prepared (see FIG. 4A and FIG. 4C). The details of the base substrate 100 and the single crystal semiconductor substrate 110, for which Embodiment 1 can be referred to, are omitted here.

Figure 4B:
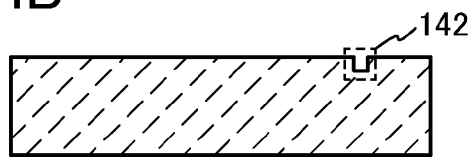

A recessed portion 142 is formed in the region at the surface of the base substrate 100, which corresponds to the periphery of the single crystal semiconductor substrate 110 (see FIG. 4B). Here, although the recessed portion 142 is formed at the surface of the base substrate 100, an embodiment of the disclosed invention is not limited to the formation of the recessed portion 142 as long as the closed region can be formed. Instead of the recessed portion, a projected portion or both the projected portion and the recessed portion may be formed. Embodiment 1 can be referred to for the details of the method for forming the closed region.

Figure 4D:
Figure 4E:
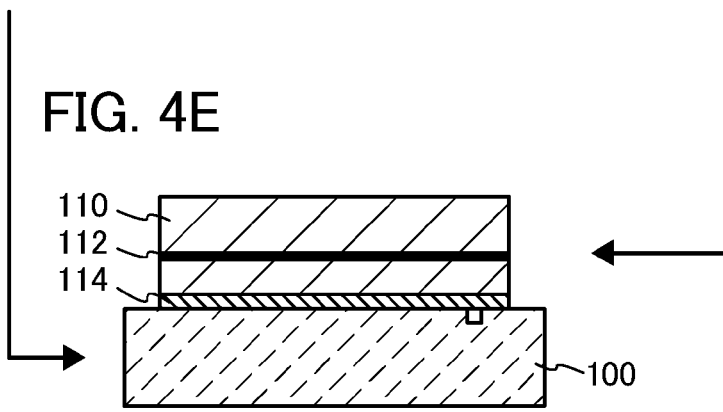

Next, the embrittled region 112 is formed in the single crystal semiconductor substrate 110 at a predetermined depth from the surface, and then the base substrate 100 and the single crystal semiconductor substrate 110 are bonded to each other with the insulating layer 114 interposed therebetween (see FIGS. 4D and 4E).

The embrittled region 112 can be formed by irradiating the single crystal semiconductor substrate 110 with ions of hydrogen or the like having kinetic energy. Embodiment 1 can be referred to for the details.

The base substrate 100 and the single crystal semiconductor substrate 110 are bonded to each other in such a manner that after the base substrate 100 and the single crystal semiconductor substrate 110 are disposed in close contact with each other with the insulating layer 114 interposed therebetween, a pressure of greater than or equal to 1 N/cm$^2$ and less than or equal to 500 N/cm$^2$ is applied to one portion of the base substrate 100 or the single crystal semiconductor substrate 110. Then, the insulating layer 114 and the base substrate 100 start to be bonded to each other from the pressure-applied portion, and the bonding automatically spreads to the entire area. This bonding step is performed under the action of the Van der Waals force or hydrogen bonding and can be performed at room temperature. Through the bonding treatment, the closed region is formed.

Note that before the single crystal semiconductor substrate 110 and the base substrate 100 are bonded to each other, surfaces to be bonded are preferably subjected to surface treatment. The surface treatment can strengthen the bonding strength at a bonding interface between the single crystal semiconductor substrate 110 and the base substrate 100. Embodiment 1 can be referred to for the details of the surface treatment.

Note that heat treatment for increasing the bonding strength may be performed after the bonding is performed. This heat treatment is performed at a temperature at which separation at the embrittled region 112 does not occur (for example, higher than or equal to room temperature and lower than 400° C.). Alternatively, the base substrate 100 and the insulating layer 114 may be bonded to each other while being heated at a temperature within this range. The heat treatment can be performed using a heating furnace such as a diffusion furnace or a resistance heating furnace, a rapid thermal annealing (RTA) apparatus, a microwave heating apparatus, or the like.

Figure 4F:
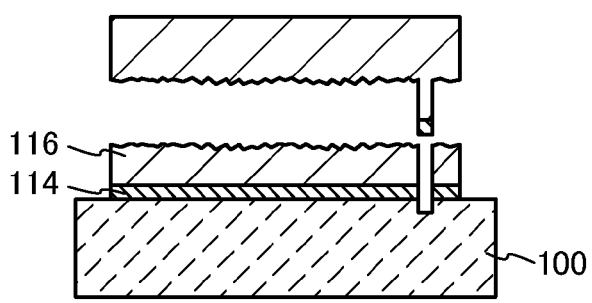
Figure 4G:
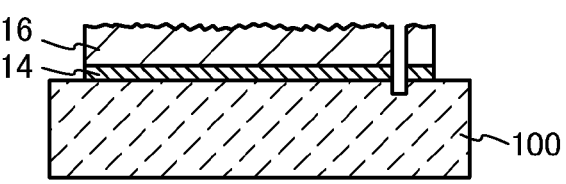

Next, heat treatment is performed for separation of the single crystal semiconductor substrate 110 at the embrittled region 112, whereby the single crystal semiconductor layer 116 is formed over the base substrate 100 with the insulating layer 114 interposed therebetween (see FIGS. 4F and 4G).

By the heat treatment, the added element is separated out into microvoids which are formed in the embrittled region 112, and the internal stress is increased. By the increased pressure, a crack is generated in the embrittled region 112, and accordingly the single crystal semiconductor substrate 110 is separated along the embrittled region 112. Because the insulating layer 114 is bonded to the base substrate 100, the single crystal semiconductor layer 116 which is separated from the single crystal semiconductor substrate 110 remains over the base substrate 100. Note that because bonding is not performed at the recessed portion 140, the single crystal semiconductor layer 116 is not formed in a region of the base substrate 100, which corresponds to the recessed portion 140. Such a region serves as a trigger for separation, and thus roughness on the surface of the single crystal semiconductor layer 116 can be suppressed.

Figure 5A:
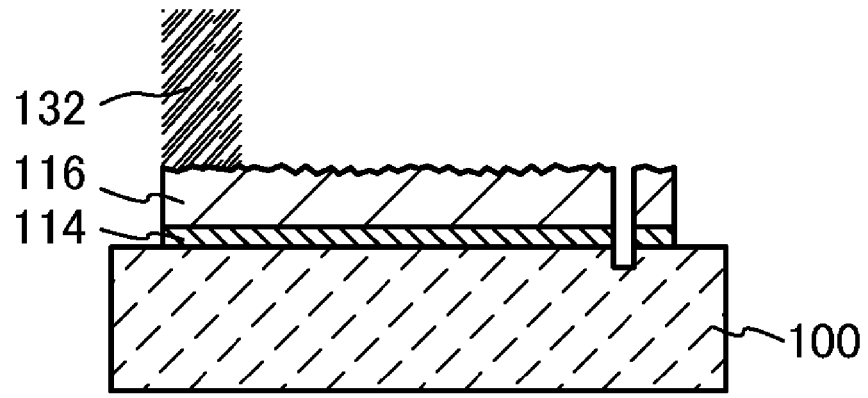
FIGS. 5A to 5C are cross-sectional views illustrating an example of a method for manufacturing an SOI substrate.
Figure 5B:
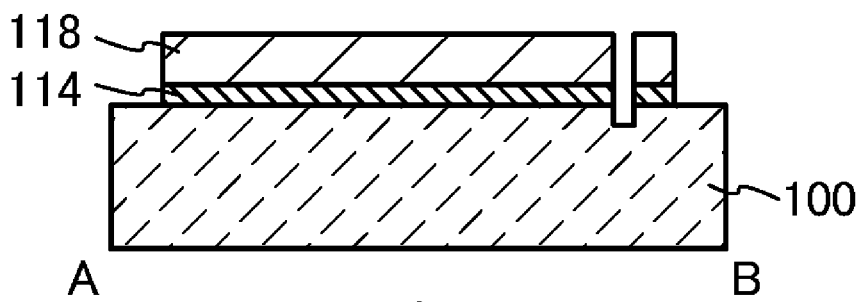
Figure 6A:
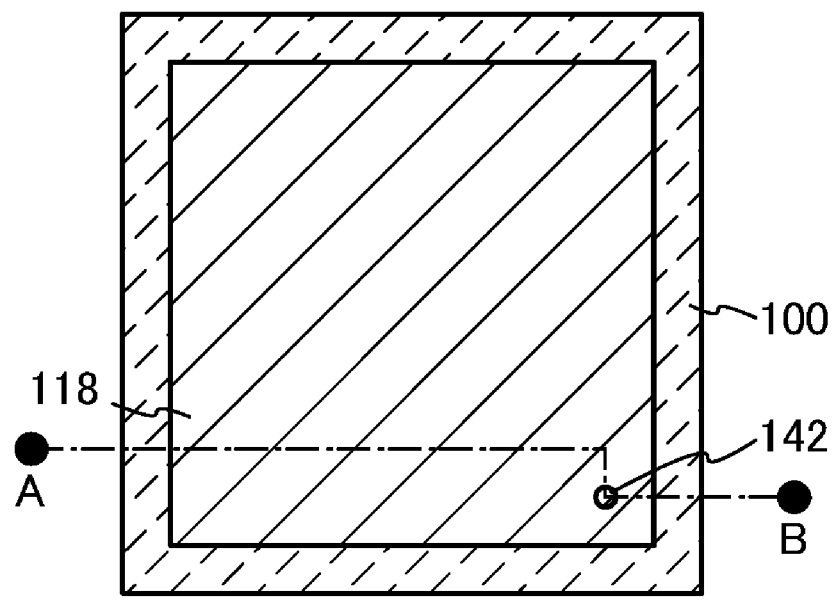
FIGS. 6A and 6B are plan views illustrating examples of methods for manufacturing an SOI substrate.

Next, a surface of the single crystal semiconductor layer 116 is irradiated with the laser light 132, thereby forming the single crystal semiconductor layer 118 where the flatness of the surface is improved and the number of defects is reduced (see FIGS. 5A and 5B and FIG. 6A). Note that FIG. 5B corresponds to a cross section taken along line A-B in FIG. 6A. Embodiment 1 can be referred to for the details of the irradiation with the laser light 132.

In this embodiment, the irradiation treatment with the laser light 132 is performed shortly after the heat treatment for separation of the single crystal semiconductor layer 116 is performed; however, an embodiment of the disclosed invention should not be construed as being limited thereto. After the heat treatment for separation of the single crystal semiconductor layer 116, etching treatment may be performed to remove a region including many defects at the surface of the single crystal semiconductor layer 116. Then, the irradiation treatment with the laser light 132 may be performed. Alternatively, after the flatness of the surface of the single crystal semiconductor layer 116 is improved, the irradiation treatment with the laser light 132 may be performed. Note that the etching treatment may be either wet etching or dry etching.

Although not described in this embodiment, after the irradiation with the laser light 132 is performed as described above, a step of thinning the single crystal semiconductor layer 118 may be performed. In order to thin the single crystal semiconductor layer 118, one of dry etching and wet etching or a combination of both of the etchings may be employed.

Through the above steps, an SOI substrate having an excellent semiconductor layer where generation of the surface roughness is suppressed can be obtained (see FIG. 5B and FIG. 6A).

Figure 5C:
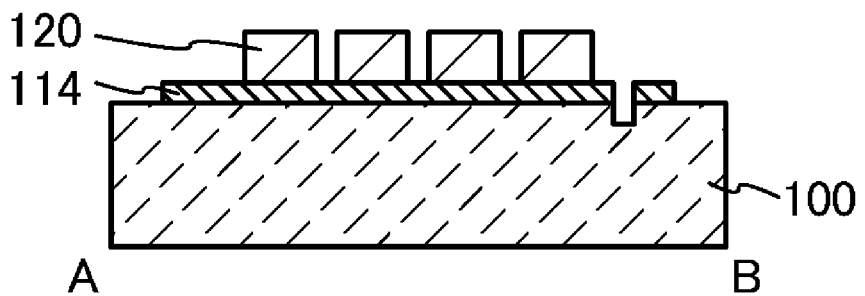
Figure 6B:
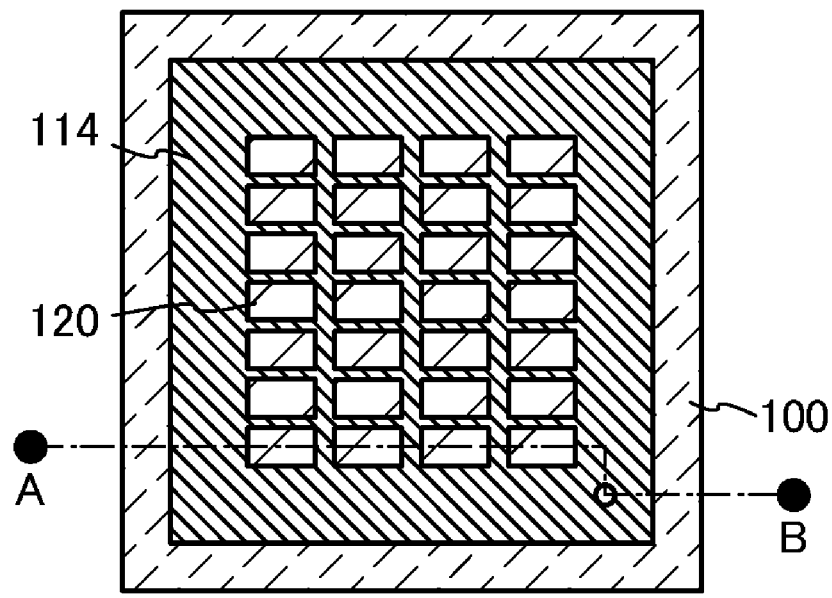

Note that after the above steps, the single crystal semiconductor layer 118 of an SOI substrate may be patterned to form an island-shaped semiconductor layer 120. In the patterning, it is desirable that the single crystal semiconductor layer 118 in the region corresponding to the periphery (in the proximity of the recessed portion 140) be removed (see FIG. 5C and FIG. 6B). Note that FIG. 5C corresponds to a cross section taken along line A-B in FIG. 6B. Here, the reason why the single crystal semiconductor layer 118 in the region corresponding to the periphery is removed is that there increases the possibility that a region which cannot be used for a semiconductor device is caused by formation of the closed region or peeling of the semiconductor layer occurs due to the shortage of the bonding strength.

Note that although the recessed portion is formed in one portion at a corner of the single crystal semiconductor layer in this embodiment (see FIG. 6A or the like), an embodiment of the disclosed invention is not limited to this structure. The number and position of the closed regions may be determined as appropriate. Note that in consideration of improvement in the manufacturing yield of semiconductor devices in a later step, it is desirable that the closed region be formed in the region to be removed in a later step (see FIG. 6B); however, an embodiment of the disclosed invention should not be construed as being limited to this structure.

The structure described in this embodiment can be used in appropriate combination with any of structures described in the other embodiments.

Embodiment 3

In this embodiment, another example of a method for manufacturing an SOI substrate is described with reference to drawings.

Figure 7A:
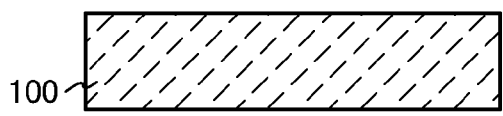
FIGS. 7A to 7G are cross-sectional views illustrating an example of a method for manufacturing an SOI substrate.
Figure 7B:
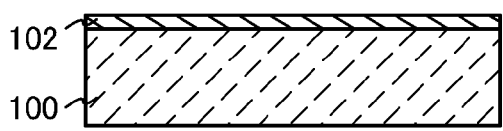
Figure 7C:
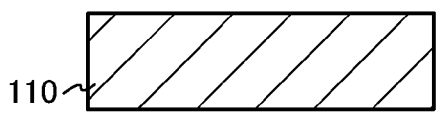

First, the base substrate 100 and the single crystal semiconductor substrate 110 as a bond substrate are prepared (see FIGS. 7A and 7C). The details of the base substrate 100 and the single crystal semiconductor substrate 110, for which Embodiment 1 or 2 can be referred to, are omitted here.

Next, a nitrogen-containing layer 102 (for example, a layer including an insulating film containing nitrogen, such as a silicon nitride ($SiN_x$) film or a silicon nitride oxide ($SiN_xO_y$ (x>y)) film) is formed over the surface of the base substrate 100 (see FIG. 7B).

The nitrogen-containing layer 102 formed in this embodiment functions as a layer (a bonding layer) to which the single crystal semiconductor layer is bonded in a later step. The nitrogen-containing layer 102 also functions as a barrier layer for preventing an impurity contained in the base substrate, such as sodium (Na), from diffusing into the single crystal semiconductor layer.

As described above, the nitrogen-containing layer 102 is used as a bonding layer in this embodiment; thus, the nitrogen-containing layer 102 is preferably formed such that its surface has a predetermined degree of flatness. Specifically, the nitrogen-containing layer 102 is formed such that it has an average surface roughness ($R_a$) of 0.5 nm or less and a root-mean-square surface roughness ($R_{ms}$) of 0.60 nm or less, preferably, an average surface roughness of 0.35 nm or less, and a root-mean-square surface roughness of 0.45 nm or less. The thickness is preferably in the range of greater than or equal to 10 nm and less than or equal to 200 nm, more preferably, greater than or equal to 50 nm and less than or equal to 100 nm. With such a high degree of surface flatness, defective bonding of a single crystal semiconductor layer can be prevented.

Figure 7D:
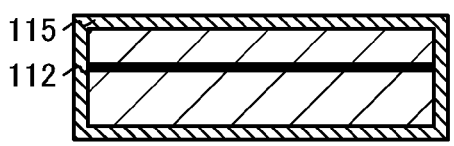

An oxide film 115 is formed on the surface of the single crystal semiconductor substrate 110 (see FIG. 7D). Note that in view of removal of contaminants, it is preferable that before the formation of the oxide film 115, a surface of the single crystal semiconductor substrate 110 be cleaned with a sulfuric acid/hydrogen peroxide mixture (SPM), an ammonium hydroxide/hydrogen peroxide mixture (APM), a hydrochloric acid/hydrogen peroxide mixture (HPM), diluted hydrofluoric acid (DHF), or the like. Alternatively, diluted hydrofluoric acid and ozone water may be discharged alternately to clean the surface of the single crystal semiconductor substrate 110.

The oxide film 115 can be formed with a single layer or a stacked layer of, for example, a silicon oxide film, a silicon oxynitride film, or the like. As a method for forming the oxide film 115, a thermal oxidation method, a CVD method, a sputtering method, or the like can be used. When the oxide film 115 is formed by a CVD method, a silicon oxide film is preferably formed using organosilane such as tetraethoxysilane (abbreviation: TEOS) (chemical formula: $Si(OC_2H_5)_4$), so that favorable bonding can be achieved.

In this embodiment, the oxide film 115 (here, a SiO, film) is formed by thermal oxidation treatment of the single crystal semiconductor substrate 110. The thermal oxidation treatment is preferably performed in an oxidizing atmosphere to which halogen is added.

For example, thermal oxidation treatment of the single crystal semiconductor substrate 110 is performed in an oxidizing atmosphere to which chlorine (Cl) is added, whereby the oxide film 115 can be formed through chlorine oxidation. In this case, the oxide film 115 contains chlorine atoms.

Chlorine atoms contained in the oxide film 115 cause distortion in the oxide film 115. As a result, the water absorptance of the oxide film 115 is increased, and the water diffusion rate is increased. In other words, when water exists at the surface of the oxide film 115, the water existing at the surface can be quickly absorbed into the oxide film 115 and diffused therein. Accordingly, defective bonding caused by water can be suppressed.

Further, with the chlorine atoms contained in the oxide film 115, heavy metal (such as Fe, Cr, Ni, or Mo) that is an extrinsic impurity can be trapped, so that contamination of the single crystal semiconductor substrate 110 can be prevented. Moreover, after the bonding to the base substrate, impurities from the base substrate, such as Na, can be fixed, so that contamination of the single crystal semiconductor substrate 110 can be prevented.

Note that the halogen atoms contained in the oxide film 115 are not limited to chlorine atoms. Fluorine atoms may be contained in the oxide film 115. As a method for fluorine oxidation of the surface of the single crystal semiconductor substrate 110, a method in which the single crystal semiconductor substrate 110 is soaked in an HF solution and then subjected to thermal oxidation treatment in an oxidizing atmosphere, a method in which thermal oxidation treatment is performed in an oxidizing atmosphere to which $NF_3$ is added, or the like can be used.

Next, the single crystal semiconductor substrate 110 is irradiated with ions accelerated by an electrical field, thereby forming the embrittled region 112 where the crystal structure is damaged, in the single crystal semiconductor substrate 110 at a predetermined depth (see FIG. 7D). Embodiment 1 or 2 can be referred to for the details. Note that heavy metal may also be added when the embrittled region 112 is formed using the ion-doping apparatus; however, the ion irradiation is performed through the oxide film 115 containing halogen atoms, whereby contamination of the single crystal semiconductor substrate 110 due to the heavy metal can be prevented.

Figure 7E:
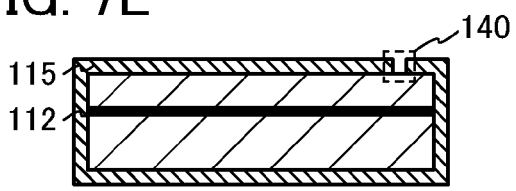

Next, the recessed portion 140 is formed in the region at the surface of the oxide film 115, which corresponds to the periphery of the single crystal semiconductor substrate 110, and a region which serves as the closed region formed using the base substrate 100 and the single crystal semiconductor substrate 110 in a later step is formed (see FIG. 7E). Such a region serves as a trigger for separation and generation of roughness on the surface of the single crystal semiconductor layer can be suppressed.

Although the closed region is formed by forming the recessed portion 140 in the insulating layer 114 in this embodiment, an embodiment of the disclosed invention should not be construed as being limited to this structure. Instead of the recessed portion, a projected portion or both the projected portion and the recessed portion may be formed. Embodiment 1 or 2 can be referred to for the details of the method for forming the closed region.

Figure 7F:
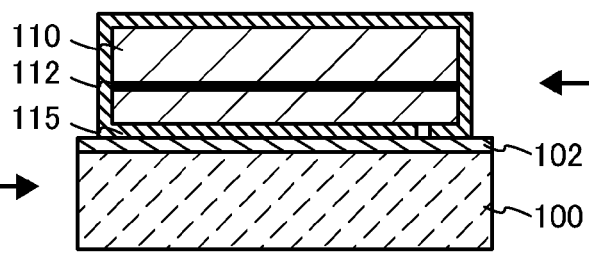

Next, the surface of the base substrate 100 and the surface of the single crystal semiconductor substrate 110 are disposed to face each other, and a surface of the nitrogen-containing layer 102 and the surface of the oxide film 115 are bonded to each other (see FIG. 7F).

In this embodiment, after the base substrate 100 and the single crystal semiconductor substrate 110 are disposed in close contact with each other with the nitrogen-containing layer 102 and the oxide film 115 interposed therebetween, a pressure of greater than or equal to 1 $N/cm^2$ and less than or equal to 500 $N/cm^2$ is applied to one portion of the base substrate 100 or the single crystal semiconductor substrate 110. Then, the nitrogen-containing layer 102 and the oxide film 115 start to be bonded to each other from the pressure-applied portion, and the bonding automatically spreads to the entire area. This bonding step is performed under the action of the Van der Waals force or hydrogen bonding and can be performed at room temperature. The closed region is formed through the bonding treatment.

Note that before the base substrate 100 and the single crystal semiconductor substrate 110 are bonded to each other, the oxide film 115 formed over the single crystal semiconductor substrate 110 and the nitrogen-containing layer 102 formed over the base substrate 100 are preferably subjected to surface treatment. Embodiment 1 or 2 can be referred to for the details of the surface treatment.

After the nitrogen-containing layer 102 and the oxide film 115 are bonded to each other, heat treatment for increasing the bonding strength is preferably performed. This heat treatment is performed at a temperature at which separation at the embrittled region 112 does not occur (for example, higher than or equal to room temperature and lower than 400° C.). Alternatively, the nitrogen-containing layer 102 and the oxide film 115 may be bonded to each other while being heated at a temperature within this range. The heat treatment can be performed using a heating furnace such as a diffusion furnace or a resistance heating furnace, a rapid thermal annealing (RTA) apparatus, a microwave heating apparatus, or the like.

Figure 7G:
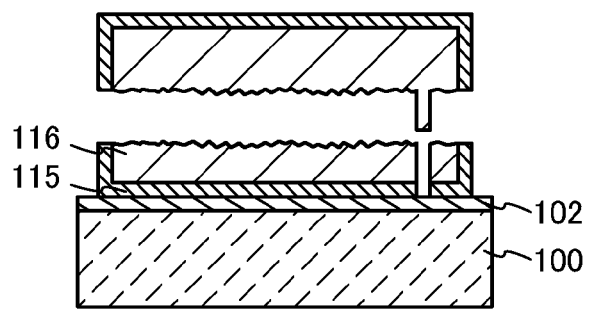

Next, heat treatment is performed for separation of the single crystal semiconductor substrate 110 at the embrittled region 112, whereby the single crystal semiconductor layer 116 is formed over the base substrate 100 with the nitrogen-containing layer 102 and the oxide film 115 interposed therebetween (see FIG. 7G and FIG. 8A). Embodiment 1 or 2 can be referred to for the details of the heat treatment. Here, the nitrogen-containing layer 102 and the oxide film 115 are not bonded to each other in the recessed portion 140. Therefore, the single crystal semiconductor layer 116 is not formed in the region of the base substrate 100, which corresponds to the recessed portion 140. Such a region serves as a trigger for separation and generation of roughness on the surface of the single crystal semiconductor layer 116 can be suppressed.

Figure 9A:
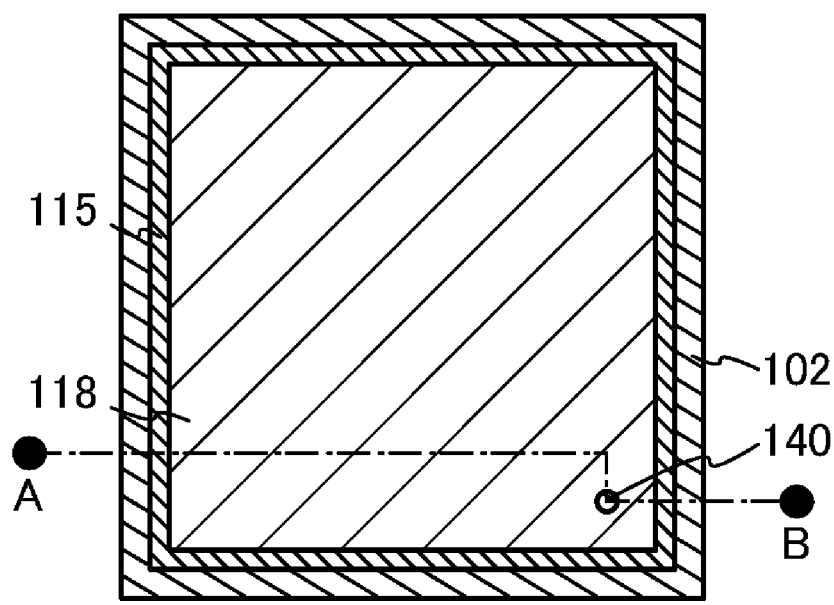
FIGS. 9A and 9B are plan views illustrating examples of methods for manufacturing an SOI substrate.

Next, the surface of the single crystal semiconductor layer 116 is irradiated with the laser light 132, thereby forming the single crystal semiconductor layer 118 where the flatness of the surface is improved and the number of defects is reduced (see FIGS. 8B and 8C and FIG. 9A). FIG. 8C corresponds to a cross section taken along line A-B in FIG. 9A. Embodiment 1 or 2 can be referred to for the details.

Note that although the irradiation treatment with the laser light 132 is performed shortly after the heat treatment for separation of the single crystal semiconductor layer 116 in this embodiment, an embodiment of the disclosed invention should not be construed as being limited thereto. After the heat treatment for separation of the single crystal semiconductor layer 116, etching treatment may be performed to remove a region including many defects at the surface of the single crystal semiconductor layer 116. Then, the irradiation treatment with the laser light 132 may be performed. Alternatively, after the flatness of the surface of the single crystal semiconductor layer 116 is improved, the irradiation treatment with the laser light 132 may be performed. Note that the etching treatment may be either wet etching or dry etching.

Although not described in this embodiment, after the irradiation with the laser light 132 is performed as described above, a step of thinning the single crystal semiconductor layer 118 may be performed. In order to thin the single crystal semiconductor layer 118, one of dry etching and wet etching or a combination of both of the etchings may be employed.

Through the above steps, an SOI substrate having an excellent semiconductor layer where generation of the surface roughness is suppressed can be obtained (see FIG. 8C and FIG. 9A).

Figure 9B:
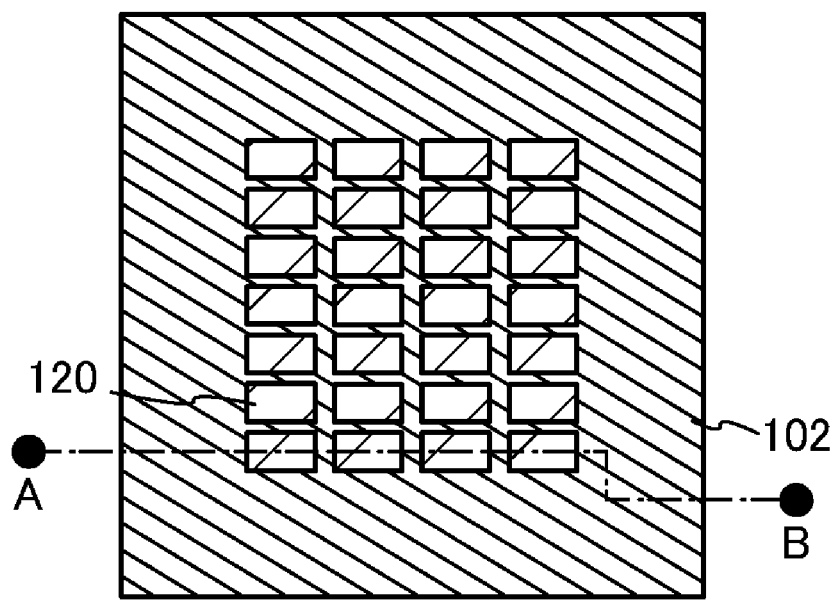

Note that after the above steps, the single crystal semiconductor layer 118 of an SOI substrate may be patterned to form an island-shaped semiconductor layer 120. In the patterning, it is desirable that the single crystal semiconductor layer 118 in the region corresponding to the periphery (in the proximity of the recessed portion 140 (or the projected portion)) be removed (see FIG. 8D and FIG. 9B). Note that FIG. 8D corresponds to a cross section taken along line A-B in FIG. 9B. Here, the reason why the single crystal semiconductor layer 118 in the region corresponding to the periphery is removed is that there increases the possibility that a region which cannot be used for a semiconductor device is caused by formation of the closed region or peeling of the semiconductor layer occurs due to the shortage of the bonding strength.

Note that although the recessed portion (or the projected portion) is formed in one portion at a corner of the single crystal semiconductor layer in this embodiment (see FIG. 9A or the like), an embodiment of the disclosed invention is not limited to this structure. The number and position of the closed regions may be determined as appropriate. Note that in consideration of improvement in the manufacturing yield of semiconductor devices in a later step, it is desirable that the closed region be formed in the region to be removed in a later step (see FIG. 9B); however, an embodiment of the disclosed invention should not be construed as being limited to this structure.

The structure described in this embodiment can be used in appropriate combination with any of structures described in the other embodiments.

Embodiment 4

In this embodiment, another example of a method for manufacturing an SOI substrate is described with reference to drawings.

Figure 10A:
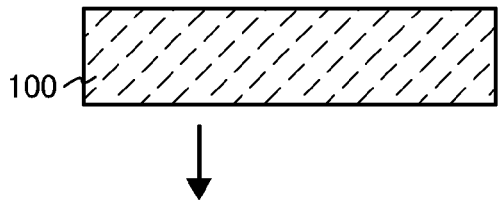
FIGS. 10A to 10H are cross-sectional views illustrating an example of a method for manufacturing an SOI substrate.
Figure 10D:
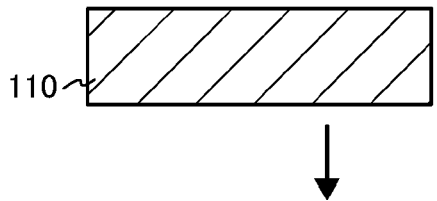

First, the base substrate 100 and the single crystal semiconductor substrate 110 as a bond substrate are prepared (see FIG. 10A and FIG. 10D). Embodiment 1, 2, or 3 can be referred to for the details of the base substrate 100 and the single crystal semiconductor substrate 110.

Figure 10B:
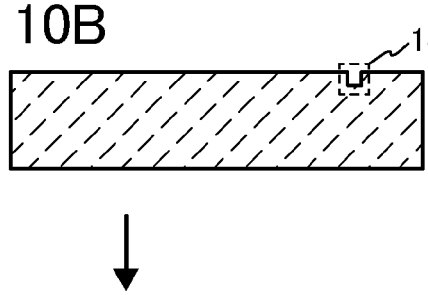

The recessed portion 142 is formed in the region at the surface of the base substrate 100, which corresponds to the periphery of the single crystal semiconductor substrate 110 (see FIG. 10B). Here, although the recessed portion 142 is formed at the surface of the base substrate 100, an embodiment of the disclosed invention is not limited to the formation of the recessed portion 142 as long as the closed region can be formed. Instead of the recessed portion, a projected portion or both the projected portion and the recessed portion may be formed. Embodiment 1, 2, or 3 can be referred to for the details of the method for forming the closed region.

Figure 10E:
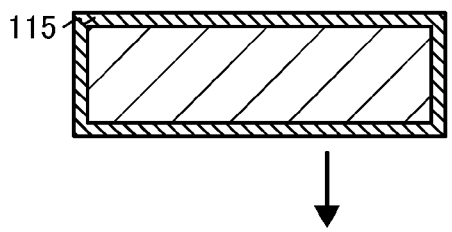
Figure 10C:
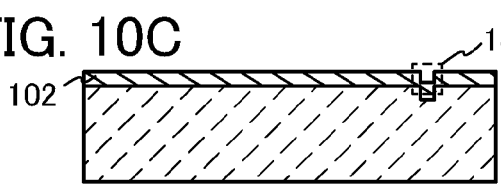

After that, a nitrogen-containing layer 102 (for example, a layer including an insulating film containing nitrogen, such as a silicon nitride ($SiN_x$) film or a silicon nitride oxide ($SiN_xO_y$, (x>y)) film) is formed over the surface of the base substrate 100 (see FIG. 10C). Because the recessed portion 142 is formed at the base substrate 100, a recessed portion 144 is formed in the nitrogen-containing layer 102. The recessed portion 144 serves as a trigger for separation and generation of roughness on the surface of the single crystal semiconductor layer 116 can be suppressed.

Note that the nitrogen-containing layer 102 formed in this embodiment functions as a layer (a bonding layer) to which the single crystal semiconductor layer is bonded in a later step. The nitrogen-containing layer 102 also functions as a barrier layer for preventing an impurity contained in the base substrate, such as sodium (Na), from diffusing into the single crystal semiconductor layer. Embodiment 1, 2, or 3 can be referred to for the details of the nitrogen-containing layer 102.

The oxide film 115 is formed on the surface of the single crystal semiconductor substrate 110 (see FIG. 10E). Embodiment 1, 2, or 3 can be referred to for the details of the oxide film 115.

Figure 10F:
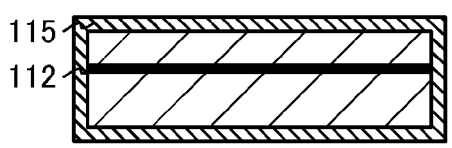

Next, the single crystal semiconductor substrate 110 is irradiated with ions accelerated by an electrical field, thereby forming the embrittled region 112 where the crystal structure is damaged, in the single crystal semiconductor substrate 110 at a predetermined depth (see FIG. 10F). Embodiment 1, 2, or 3 can be referred to for the details. Note that heavy metal may also be added when the embrittled region 112 is formed using the ion-doping apparatus; however, the ion irradiation is performed through the oxide film 115 containing halogen atoms, whereby contamination of the single crystal semiconductor substrate 110 due to the heavy metal can be prevented.

Figure 10G:
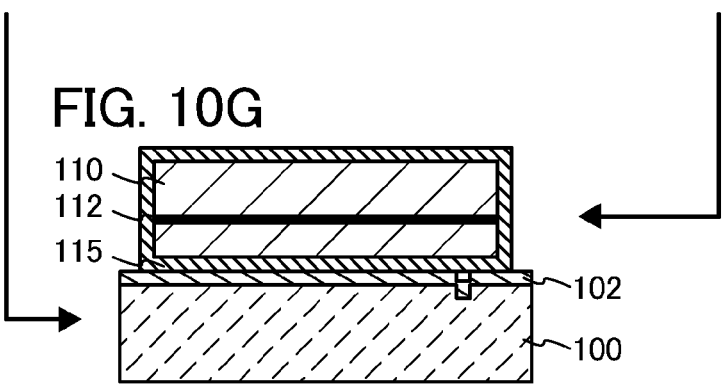

Next, the surface of the base substrate 100 and the surface of the single crystal semiconductor substrate 110 are disposed to face each other, and the surface of the nitrogen-containing layer 102 and the surface of the oxide film 115 are bonded to each other (see FIG. 10G).

In this embodiment, after the base substrate 100 and the single crystal semiconductor substrate 110 are disposed in close contact with each other with the nitrogen-containing layer 102 and the oxide film 115 interposed therebetween, a pressure of greater than or equal to 1 $N/cm^2$ and less than or equal to 500 $N/cm^2$ is applied to one portion of the base substrate 100 or the single crystal semiconductor substrate 110. Then, the nitrogen-containing layer 102 and the oxide film 115 start to be bonded to each other from the pressure-applied portion, and the bonding automatically spreads to the entire area. This bonding step is performed under the action of the Van der Waals force or hydrogen bonding and can be performed at room temperature. The closed region is formed through the bonding treatment.

Note that before the base substrate 100 and the single crystal semiconductor substrate 110 are bonded to each other, the oxide film 115 formed over the single crystal semiconductor substrate 110 and the nitrogen-containing layer 102 formed over the base substrate 100 are preferably subjected to surface treatment. Embodiment 1, 2, or 3 can be referred to for the details of the surface treatment.

After the nitrogen-containing layer 102 and the oxide film 115 are bonded to each other, heat treatment for increasing the bonding strength is preferably performed. This heat treatment is performed at a temperature at which separation at the embrittled region 112 does not occur (for example, higher than or equal to room temperature and lower than 400° C.). Alternatively, the nitrogen-containing layer 102 and the oxide film 115 may be bonded to each other while being heated at a temperature within this range. The heat treatment can be performed using a heating furnace such as a diffusion furnace or a resistance heating furnace, a rapid thermal annealing (RTA) apparatus, a microwave heating apparatus, or the like.

Figure 10H:
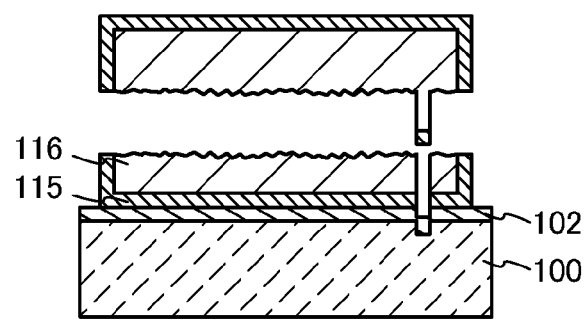
Figure 11A:
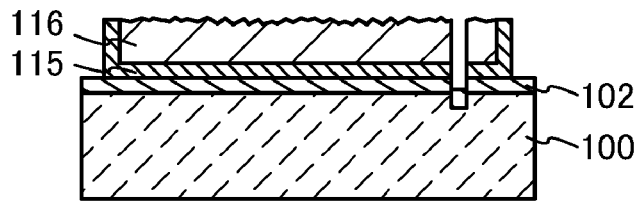
FIGS. 11A to 11D are cross-sectional views illustrating an example of a method for manufacturing an SOI substrate.

Next, heat treatment is performed for separation of the single crystal semiconductor substrate 110 at the embrittled region 112, whereby the single crystal semiconductor layer 116 is formed over the base substrate 100 with the nitrogen-containing layer 102 and the oxide film 115 interposed therebetween (see FIGS. 10H and 11A). Embodiment 1, 2, or 3 can be referred to for the details of the heat treatment. Here, bonding is not performed in the recessed portion 144; thus, the single crystal semiconductor layer 116 is not formed in the region of the base substrate 100, which corresponds to the recessed portion 144. Such a region serves as a trigger for separation and generation of roughness on the surface of the single crystal semiconductor layer 116 can be suppressed.

Figure 11B:
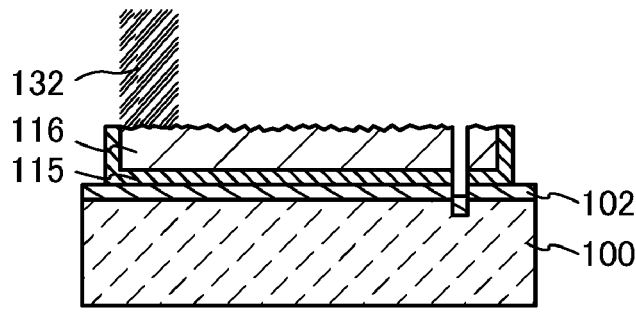
Figure 11C:
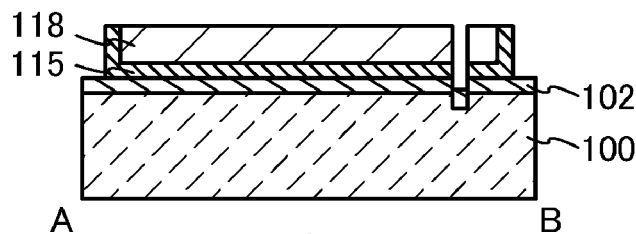
Figure 12A:
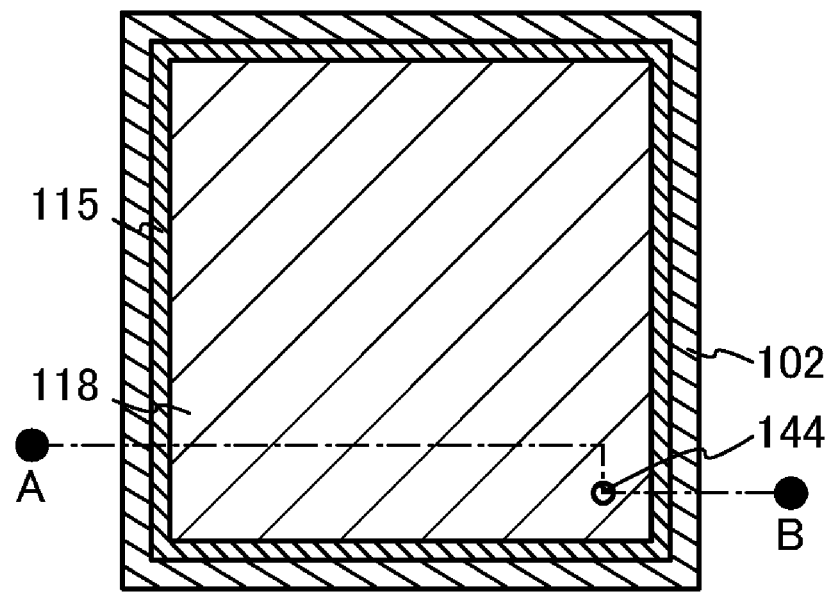
FIGS. 12A and 12B are plan views illustrating examples of methods for manufacturing an SOI substrate.

Next, the surface of the single crystal semiconductor layer 116 is irradiated with the laser light 132, thereby forming the single crystal semiconductor layer 118 where the flatness of the surface is improved and the number of defects is reduced (see FIGS. 11B and 11C and FIG. 12A). FIG. 11C corresponds to a cross section taken along line A-B in FIG. 12A. Embodiment 1, 2, or 3 can be referred to for the details.

Note that although the irradiation treatment with the laser light 132 is performed shortly after the heat treatment for separation of the single crystal semiconductor layer 116 in this embodiment, an embodiment of the disclosed invention should not be construed as being limited thereto. After the heat treatment for separation of the single crystal semiconductor layer 116, etching treatment may be performed to remove a region including many defects at the surface of the single crystal semiconductor layer 116. Then, the irradiation treatment with the laser light 132 may be performed. Alternatively, after the flatness of the surface of the single crystal semiconductor layer 116 is improved, the irradiation treatment with the laser light 132 may be performed. Note that the etching treatment may be either wet etching or dry etching.

Although not described in this embodiment, after the irradiation with the laser light 132 is performed as described above, a step of thinning the single crystal semiconductor layer 118 may be performed. In order to thin the single crystal semiconductor layer 118, one of dry etching and wet etching or a combination of both of the etchings may be employed.

Through the above steps, an SOI substrate having an excellent semiconductor layer where generation of the surface roughness is suppressed can be obtained (see FIG. 11C and FIG. 12A).

Figure 11D:
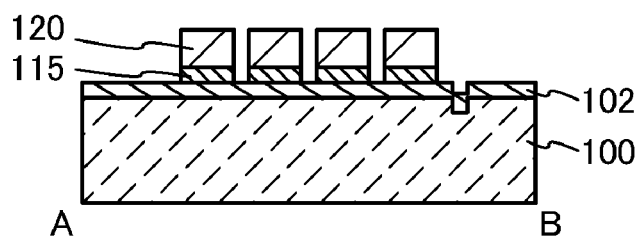
Figure 12B:
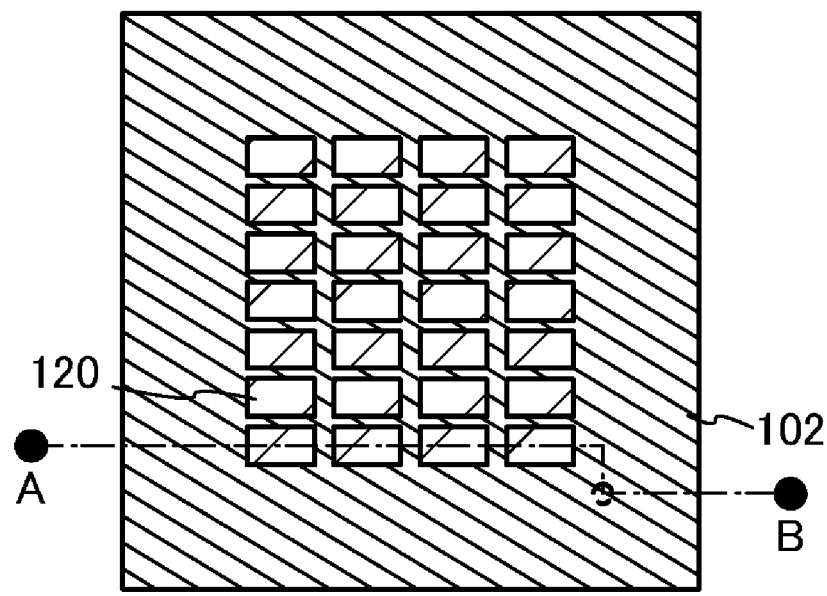

Note that after the above steps, the single crystal semiconductor layer 118 of an SOI substrate may be patterned to form an island-shaped semiconductor layer 120. In the patterning, it is desirable that the single crystal semiconductor layer 118 in the region corresponding to the periphery (in the proximity of the recessed portion 144) be removed (see FIG. 11D and FIG. 12B). Note that FIG. 11D corresponds to a cross section taken along line A-B in FIG. 12B. Here, the reason why the single crystal semiconductor layer 118 in the region corresponding to the periphery is removed is that there increases the possibility that a region which cannot be used for a semiconductor device is caused by formation of the closed region or peeling of the semiconductor layer occurs due to the shortage of the bonding strength.

Note that although the recessed portion is formed in one portion at a corner of the single crystal semiconductor layer in this embodiment (see FIG. 12A or the like), an embodiment of the disclosed invention is not limited to this structure. The number and position of the closed regions may be determined as appropriate. Note that in consideration of improvement in the manufacturing yield of semiconductor devices in a later step, it is desirable that the closed region be formed in the region to be removed in a later step (see FIG. 12B); however, an embodiment of the disclosed invention should not be construed as being limited to this structure.

The structure described in this embodiment can be used in appropriate combination with any of structures described in the other embodiments.

Embodiment 5

In this embodiment, a detailed example of a closed region and a mechanism of separation of the single crystal semiconductor substrate are described with reference to FIGS. 13A to 13D, FIGS. 14A to 14C, FIGS. 15A to 15C, and FIGS. 16A to 16D.

FIGS. 13A to 13D each illustrate an example of a cross section of a substrate in the case of forming a recessed portion, a projected portion, or a projected and recessed portion to form a closed region. Note that although a case where a recessed portion and the like are formed on a base substrate 1300 side is described in this embodiment, an embodiment of the disclosed invention is not limited to this structure. A recessed portion and the like can also be formed on a bond substrate side in a similar manner. Moreover, although a case where a recessed portion and the like are directly formed at the substrate is described in this embodiment, an embodiment of the disclosed invention is not limited to this structure. For example, an insulating layer formed over a surface of the substrate may be processed to form a recessed portion and the like.

Figure 13A:
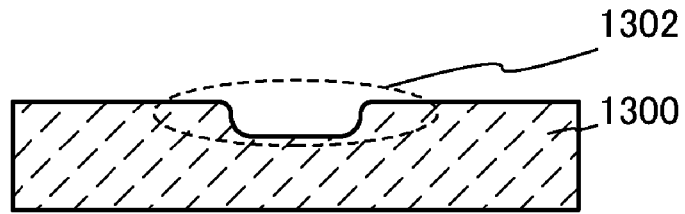
FIGS. 13A to 13D are cross-sectional views each illustrating an example of a recessed portion, a projected portion, or a projected and recessed portion.

FIG. 13A illustrates a cross-sectional shape of the base substrate 1300 in the case where a recessed portion 1302 is formed at the base substrate 1300. As the method for forming the recessed portion 1302, etching treatment, laser light irradiation treatment, treatment of forming damage with dynamic means (such as a sharp knife), and the like can be employed. It is needless to say that the recessed portion 1302 can be formed by another method. Note that the size of the recessed portion 1302 (such as a depth) can be determined as appropriate in accordance with the size of the "closed region".

Figure 13B:
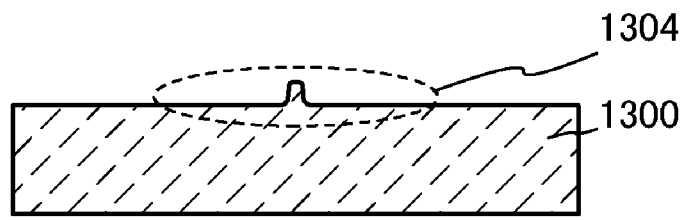

FIG. 13B illustrates a cross-sectional shape of the base substrate 1300 in the case where a projected portion 1304 is formed at the base substrate 1300. As the method for forming the projected portion 1304, etching treatment, laser light irradiation treatment, and the like can be employed. It is needless to say that the projected portion 1304 can be formed by another method. Note that the size of the projected portion 1304 (such as a height) can be determined as appropriate in accordance with the size of the "closed region".

Figure 13C:
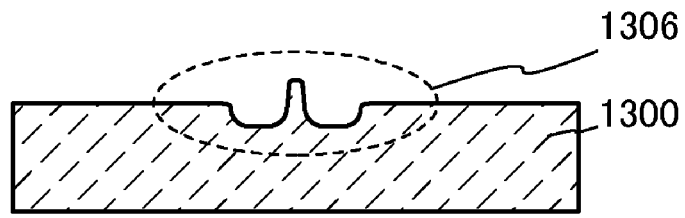

FIG. 13C illustrates a cross-sectional shape of the base substrate 1300 in the case where a projected and recessed portion 1306 is formed at the base substrate 1300. As the method for forming the projected and recessed portion 1306, etching treatment, laser light irradiation treatment, treatment of forming damage with dynamic means (such as a sharp knife), and the like can be employed. It is needless to say that the projected and recessed portion 1306 can be formed by another method. Note that the size of the projected and recessed portion 1306 (such as a height and a depth) can be determined as appropriate in accordance with the size of the "closed region".

Figure 13D:
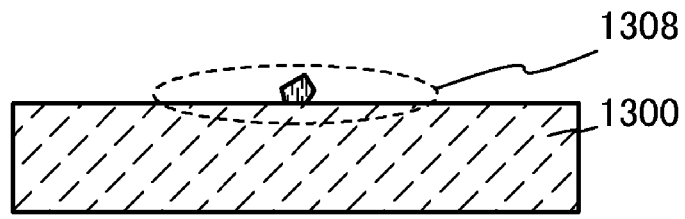

FIG. 13D illustrates a cross-sectional shape of the base substrate 1300 in the case where a projected portion 1308 is formed by placing a grain or a particle. There is no particular limitation on the grain or the particle; however, it is desirable that the grain or the particle be formed using a material which does not adversely affect a semiconductor layer to be formed. Moreover, the size of the grain or the particle can be determined as appropriate in accordance with the size of the "closed region".

Although four kinds of cross-sectional shapes are described in this embodiment, an embodiment of the disclosed invention is not limited to this mode. Because formation of the "closed region" is the essence of an embodiment of the disclosed invention, any method can be employed as long as the "closed region" is formed.

Figure 14A:
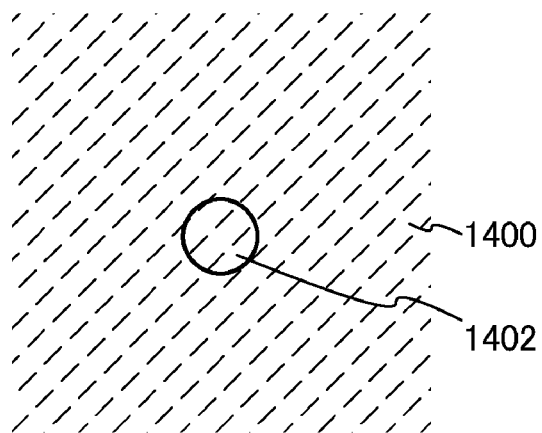
Figure 14B:
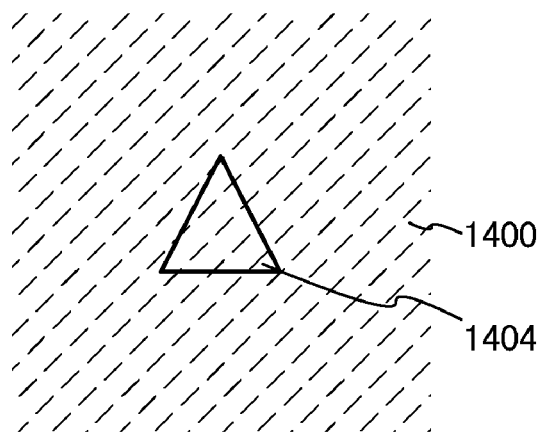
Figure 14C:
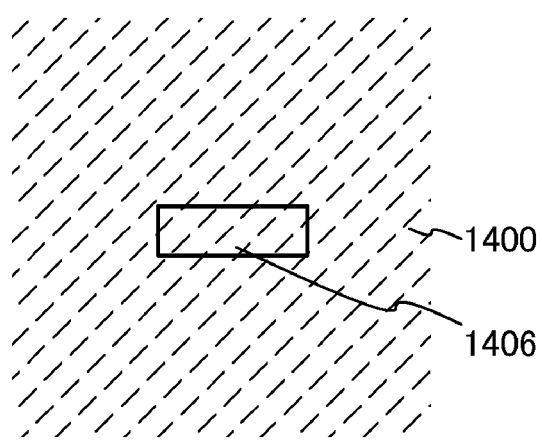

FIGS. 14A to 14C are plan views each illustrating an example of a shape of a recessed portion, a projected portion, or a projected and recessed portion for forming the closed region. Note that although a case where a recessed portion and the like are formed on a base substrate 1400 side is described in this embodiment, an embodiment of the disclosed invention is not limited to this structure. A recessed portion and the like can also be formed on a bond substrate side in a similar manner. Moreover, although a case where a recessed portion and the like are directly formed at the substrate is described in this embodiment, an embodiment of the disclosed invention is not limited to this structure. For example, an insulating layer formed over a surface of the substrate may be processed to form a recessed portion and the like.

FIG. 14A illustrates a plan view in the case where a circular recessed portion 1402 and the like are formed at the base substrate 1400. The above formation method can be referred to for the method for forming the recessed portion 1402 and the like. Moreover, the size of the recessed portion 1402 and the like (an area and the like in a plan view) can be determined as appropriate in accordance with the size of the "closed region".

FIG. 14B illustrates a plan view in the case where a triangle-shaped recessed portion 1404 and the like are formed. The above formation method can be referred to for the method for forming the recessed portion 1404 and the like. Moreover, the size of the recessed portion 1404 and the like (an area and the like in a plan view) can be determined as appropriate in accordance with the size of the "closed region". Note that although an example where the triangle-shaped recessed portion 1404 and the like are formed is described here, the number of edges is not particularly limited.

FIG. 14C illustrates a plan view in the case where a rectangular-shaped recessed portion 1406 and the like are formed. The above formation method can be referred to for the method for forming the recessed portion 1406 and the like. Moreover, the size of the recessed portion 1406 and the like (an area and the like in a plan view) can be determined as appropriate in accordance with the size of the "closed region". Note that although an example where the rectangular-shaped recessed portion 1406 and the like are formed is described here, the shapes of the recessed portion and the like are not limited to this mode.

Although three kinds of plan view shapes are described in this embodiment, an embodiment of the disclosed invention is not limited to this mode. For example, any plan view shape such as a star shape, a cross shape, or an L shape can be employed as long as the "closed region" can be formed.

FIGS. 15A to 15C and FIGS. 16A to 16D illustrate separation of a semiconductor layer in the case where the "closed region" is formed.

Figure 15A:
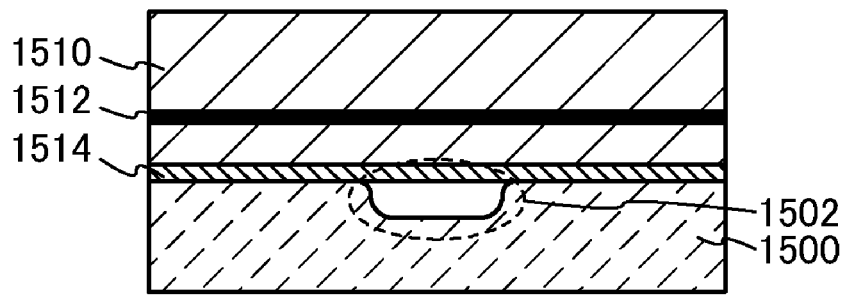
FIGS. 15A to 15C are views illustrating separation of a semiconductor layer.
Figure 15B:
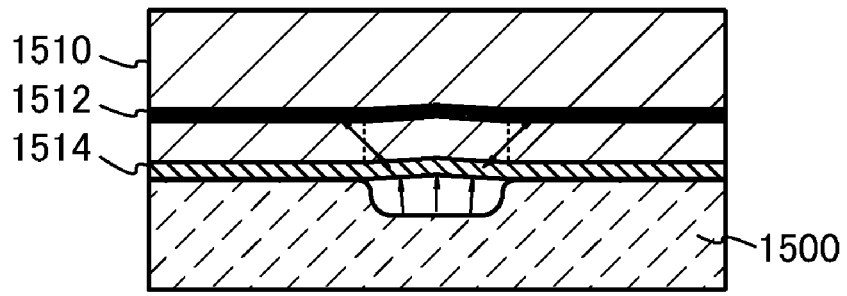
Figure 15C:
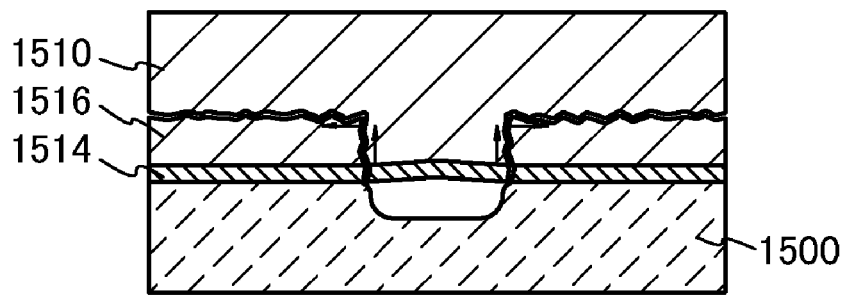

FIGS. 15A to 15C illustrate a case where a closed region 1502 is formed by forming the recessed portion, which is illustrated in FIG. 13A, at a base substrate 1500. Note that as for a structure on a bond substrate side, an embrittled region 1512 is formed in a single crystal semiconductor substrate 1510 and an insulating layer 1514 is formed over a surface. That is, the structure illustrated in FIGS. 15A to 15C is similar to those illustrated in FIGS. 4A to 4G, FIGS. 5A to 5C, and FIGS. 6A and 6B. It is needless to say that an embodiment of the disclosed invention should not be construed as being limited to the structure illustrated in FIGS. 4A to 4G, FIGS. 5A to 5C, FIGS. 6A and 6B, or FIGS. 15A to 15C.

FIG. 15A illustrates the base substrate 1500 and the single crystal semiconductor substrate 1510 shortly after they are bonded to each other. A large stress is not applied to the substrates and films in this state.

FIG. 15B illustrates the stress generated by heat treatment after the base substrate 1500 and the single crystal semiconductor substrate 1510 are bonded to each other. As illustrated in FIG. 15B, a large stress is generated on the single crystal semiconductor substrate side around a boundary of the closed region 1502 due to difference in the thermal expansion coefficients of the base substrate 1500 and the single crystal semiconductor substrate 1510. Moreover, it can also be considered that a gas in the closed region 1502 expands and thus a stress is generated on the single crystal semiconductor substrate side.

When such a stress occurs, the closed region serves as a trigger and separation of a single crystal semiconductor layer 1516 proceeds. FIG. 15C illustrates that separation of the single crystal semiconductor layer 1516 proceeds from the closed region 1502.

Note that in the case where a region where bonding is not performed and which is not closed is formed, the stress generated by heat treatment or the like is relieved. Thus, the effect tends to decrease as compared to the case where the closed region is formed. The region where bonding is not performed and which is closed is preferably formed to make the most of the effect and thus form an excellent semiconductor layer.

FIGS. 16A to 16D illustrate a case where a closed region 1602 is formed by the formation of the projected and recessed portion, which are illustrated in FIG. 13C, at a base substrate 1600. A basic mechanism is the same as the basic mechanism in the case of FIGS. 15A to 15C; however, it can be considered that separation can be realized more effectively in the case of FIGS. 16A to 16D because a projected portion is formed. Note that here, on a bond substrate side, an embrittled region 1612 is formed in a single crystal semiconductor substrate 1610 and an insulating layer 1614 is formed over a surface of the single crystal semiconductor substrate 1610. That is, the structure illustrated in FIGS. 16A to 16D is similar to those illustrated in FIGS. 4A to 4G, FIGS. 5A to 5C, and FIGS. 6A and 6B. It is needless to say that an embodiment of the disclosed invention should not be construed as being limited to the structure illustrated in FIGS. 4A to 4G, FIGS. 5A to 5C, FIGS. 6A and 6B, or FIGS. 16A to 16D.

FIG. 16A illustrates the base substrate 1600 before bonding is performed.

FIG. 16B illustrates the base substrate 1600 and the single crystal semiconductor substrate 1610 shortly after they are bonded to each other. A large stress is not applied to the substrates and films in this state except that the single crystal semiconductor substrate 1610 is locally pressed by the projected portion. In this state, the shapes of the base substrate 1600 and the single crystal semiconductor substrate 1610 are altered due to the projected portion. The level of the change depends on the elastic moduli of both the substrates. For example, in the case where a glass substrate is used as the base substrate 1600 and a single crystal silicon substrate is used as the single crystal semiconductor substrate 1610, the level of the change of the glass substrate tends to increase because the glass substrate is softer.

FIG. 16C illustrates the stress generated by heat treatment after the base substrate 1600 and the single crystal semiconductor substrate 1610 are bonded to each other. As illustrated in FIG. 16C, a large stress is generated on the single crystal semiconductor substrate side around a boundary of the closed region 1602 due to difference in the thermal expansion coefficients of the base substrate 1600 and the single crystal semiconductor substrate 1610. Moreover, it can also be considered that a gas in the closed region 1602 expands and thus a stress is generated on the single crystal semiconductor substrate side.

It can be considered that because the single crystal semiconductor substrate 1610 is locally pressed by the projected portion of the base substrate 1600 in the structure illustrated in FIGS. 16A to 16D, a stress is remarkably generated. When such a stress occurs, the closed region serves as a trigger and separation of a single crystal semiconductor layer 1616 proceeds. FIG. 16D illustrates that separation of the single crystal semiconductor layer 1616 proceeds from the closed region 1602.

Note that in the case where a region where bonding is not performed and which is not closed is formed, the stress generated by heat treatment or the like is relieved. Thus, the effect tends to decrease as compared to the case where the closed region is formed. The region where bonding is not performed and which is closed is preferably formed to make the most of the effect and thus form an excellent semiconductor layer.

Figure 17A:
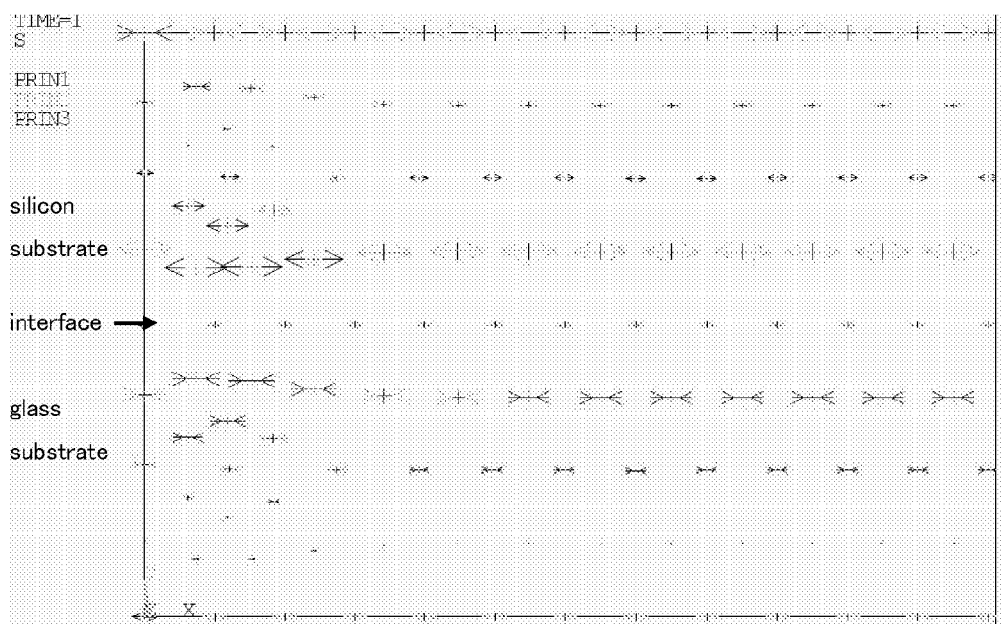
FIGS. 17A and 17B are views each showing a stress.
Figure 17B:
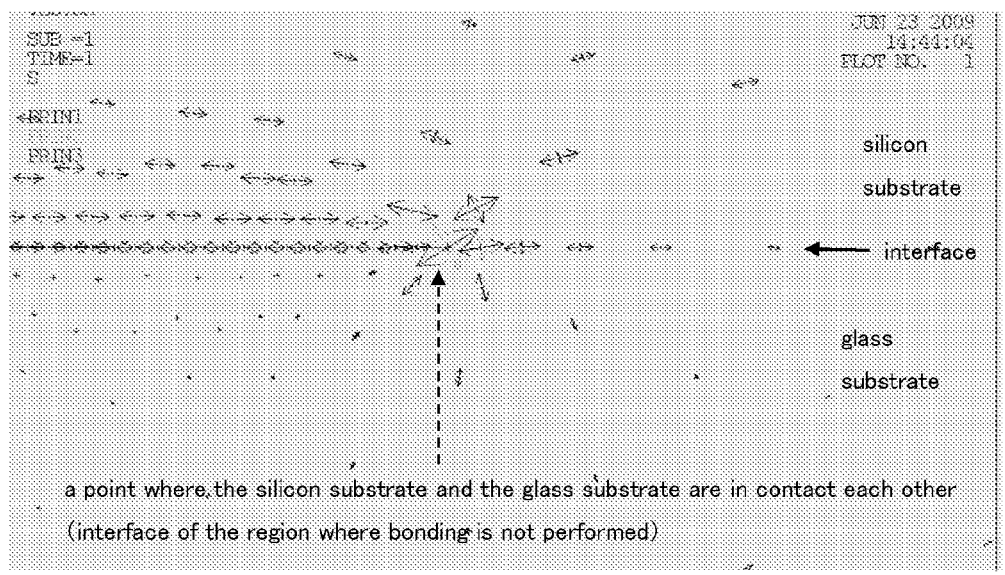

Next, computer calculation results of the stress generated in the substrate are shown (see FIGS. 17A and 17B). Here, the state where the temperature of all elements taken into consideration in calculation is uniformly 27° C. is assumed that distortion does not occur and stress is not generated. Under these conditions, the stress and change when the temperature of all elements taken into consideration in calculation is uniformly 500° C. are calculated. Finite element method analysis software, ANSYS, is used for the calculation.

A base substrate having a 3-μm-high projected portion and a bond substrate (here, a single crystal semiconductor substrate), which are bonded to each other, are used as a calculation model. As a comparison example, a base substrate where the projected portion is not formed (a flat base substrate) and a bond substrate, which are bonded to each other, are used for similar calculation. Note that the parameter of a glass substrate is used for the base substrate. The parameter of a silicon substrate is used for a bond substrate (a single crystal semiconductor substrate).

FIG. 17A illustrates the stress after heat treatment when the projected portion is not formed and thus the closed region is not formed. FIG. 17B illustrates the stress after heat treatment when the projected portion is formed and thus the closed region is formed. Note that in the case where the closed region is formed, calculation is performed under the condition where the pressure in the region is 3 atmospheres. Further, the size and direction of arrows in drawings mean the size and direction of the applied stress, respectively.

From FIG. 17A, it can be found that a stress is generated along an interface when the closed region is not formed. Moreover, from FIG. 17B, it can be found that a large stress is generated around the boundary of the closed region in the case where the closed region is formed. More specifically, in the case where the closed region is formed, generation of a strong tensile stress oblique to the interface is observed around a point where the silicon substrate and the glass substrate are in contact with each other.

In the case where the closed region is not formed, a stress acts only along the interface; thus, influence of the stress in separation is extremely small. On the other hand, in the case where the closed region is formed, a stress acts in a direction oblique to the interface; thus, it can be considered that the stress has a great influence on separation.

As described above, from the computer calculation results, it is confirmed that when the closed region is formed, the stress has a great influence on separation of the semiconductor layer. Application of such a stress to a mechanism of separation is effective at forming an excellent semiconductor layer.

The structure described in this embodiment can be used in appropriate combination with any of structures described in the other embodiments.

Embodiment 6

In this embodiment, a method for manufacturing a semiconductor device in any of the above embodiments is described in detail with reference to FIGS. 18A to 18D, FIGS. 19A to 19D, and FIGS. 20A and 20B. Here, a method for manufacturing a semiconductor device including a plurality of transistors is described as an example of the semiconductor device. Various semiconductor devices can be formed with the use of transistors described below in combination.

Figure 18A:
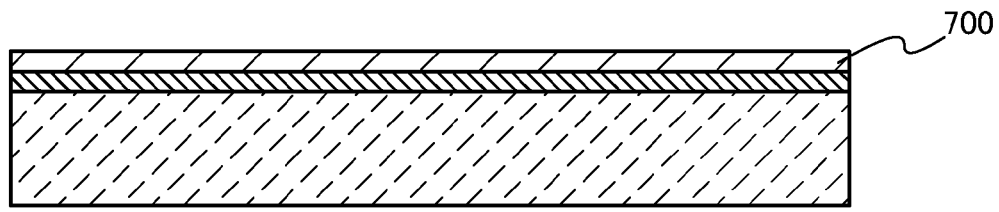
FIGS. 18A to 18D are cross-sectional views illustrating an example of a method for manufacturing a semiconductor device (transistor)

FIG. 18A is a cross-sectional view illustrating part of a semiconductor substrate which is manufactured employing the method described in Embodiment 1 or the like (for example, see FIG. 2B or the like). Note that although the case where a semiconductor device is manufactured using the semiconductor substrate formed in Embodiment 1 is described in this embodiment, it is needless to say that a semiconductor substrate formed in any of the other embodiments may be used.

In order to control threshold voltages of TFTs, a p-type impurity element such as boron, aluminum, or gallium or an n-type impurity element such as phosphorus or arsenic may be added to a semiconductor layer 700 (corresponding to the single crystal semiconductor layer 118 in FIG. 2B). A region to which the impurity element is added and the kind of impurity element to be added can be changed as appropriate. For example, a p-type impurity element is added to a formation region of an n-channel TFT, and an n-type impurity element is added to a formation region of a p-channel TFT. The impurity element may be added at a dose of approximately greater than or equal to $1 \times 10^{15}/cm^2$ and less than or equal to $1 \times 10^{17}/cm^2$.

Figure 18B:
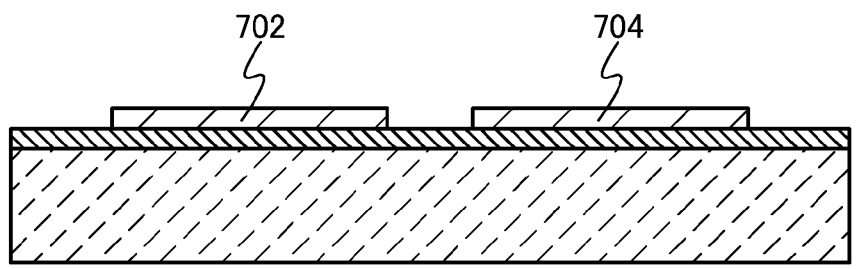

Then, the semiconductor layer 700 is divided into an island shape to form a semiconductor layer 702 and a semiconductor layer 704 (see FIG. 18B). Note that at this time, the single crystal semiconductor layer 118 is desirably removed in a region corresponding to a periphery (in the proximity of a region where bonding is not performed) (for example, see FIG. 2C or the like).

Next, a gate insulating film 706 is formed so as to cover the semiconductor layer 702 and the semiconductor layer 704

Figure 18C:
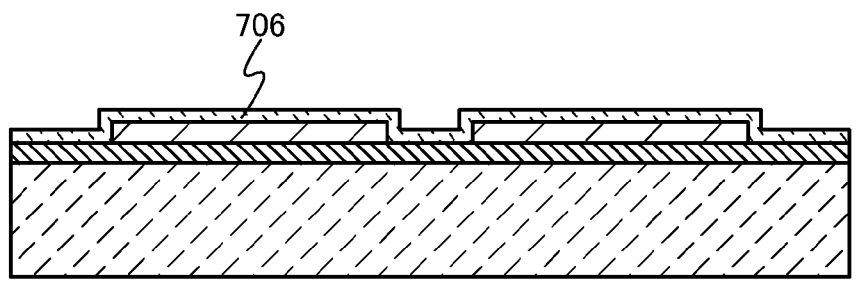

(see FIG. 18C). Here, a single-layer silicon oxide film is formed by a plasma CVD method. Alternatively, a film containing silicon oxynitride, silicon nitride oxide, silicon nitride, hafnium oxide, aluminum oxide, tantalum oxide, or the like may be formed to have a single-layer structure or a stacked-layer structure as the gate insulating film 706.

As a manufacturing method other than a plasma CVD method, a sputtering method or a method using oxidation or nitridation by high density plasma treatment can be employed. High-density plasma treatment is performed using, for example, a mixed gas of a noble gas such as helium, argon, krypton, or xenon and a gas such as oxygen, nitrogen oxide, ammonia, nitrogen, or hydrogen. In this case, if plasma excitation is performed by introduction of microwaves, plasma with low electron temperature and high density can be generated. The surfaces of the semiconductor layers are oxidized or nitrided with oxygen radicals (OH radicals may be included) or nitrogen radicals (NH radicals may be included) which are generated by such high-density plasma, whereby the insulating film is formed to a thickness of greater than or equal to 1 nm and less than or equal to 20 nm, preferably, greater than or equal to 2 nm and less than or equal to 10 nm to be in contact with the semiconductor layers.

Because the oxidation or nitridation of the semiconductor layers through the high-density plasma treatment is a solid-phase reaction, the interface state density between the gate insulating film 706 and each of the semiconductor layers 702 and 704 can be drastically reduced. Further, when the semiconductor layers 702 and 704 are directly oxidized or nitrided by the high-density plasma treatment, variation in the thickness of the insulating film to be formed can be suppressed. Because the semiconductor layers are single crystal layers, even when the surfaces of the semiconductor layers are oxidized by a solid-phase reaction by using the high-density plasma treatment, a gate insulating film with high uniformity and low interface state density can be formed. When an insulating film formed through high-density plasma treatment as described above is used for a part or whole of the gate insulating film of a transistor, variation in characteristics can be suppressed.

Alternatively, the gate insulating film 706 may be formed by thermally oxidizing the semiconductor layer 702 and the semiconductor layer 704. In the case of such thermal oxidation, it is necessary to use a glass substrate having a certain degree of heat resistance.

Note that after the gate insulating film 706 containing hydrogen is formed, hydrogen contained in the gate insulating film 706 may be dispersed into the semiconductor layer 702 and the semiconductor layer 704 by performing heat treatment at a temperature of higher than or equal to 350° C. and lower than or equal to 450° C. In this case, the gate insulating film 706 can be formed using silicon nitride or silicon nitride oxide by a plasma CVD method. Note that the process temperature is preferably 350° C. or lower. If hydrogen is supplied to the semiconductor layer 702 and the semiconductor layer 704 in this manner, defects in the semiconductor layer 702, in the semiconductor layer 704, at the interface between the gate insulating film 706 and the semiconductor layer 702, and at the interface between the gate insulating film 706 and the semiconductor layer 704 can be effectively reduced.

Figure 18D:
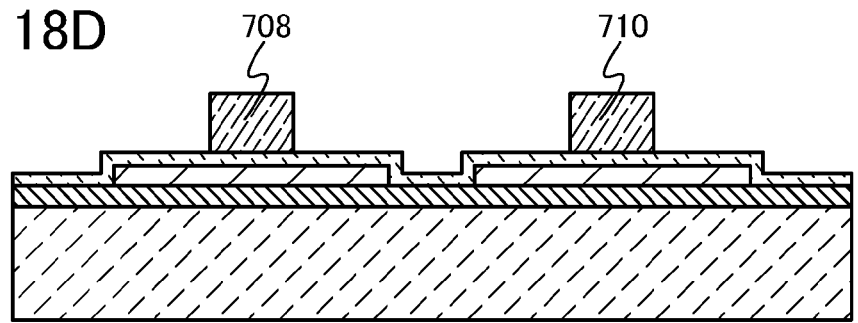

Next, a conductive film is formed over the gate insulating film 706, and then, the conductive film is processed (patterned) into a predetermined shape, whereby an electrode 708 and an electrode 710 are formed over the semiconductor layer 702 and the semiconductor layer 704, respectively (see FIG. 18D). The conductive film can be formed with a CVD method, a sputtering method, or the like. The conductive film can be formed using a material such as tantalum (Ta), tungsten (W), titanium (Ti), molybdenum (Mo), aluminum (Al), copper (Cu), chromium (Cr), or niobium (Nb). Alternatively, an alloy material containing the above metal as its main component or a compound containing the above metal may be used. Still alternatively, a semiconductor material, such as polycrystalline silicon which is obtained by doping a semiconductor with an impurity element that imparts a conductivity type, may be used.

Although the electrodes 708 and 710 are formed using a single-layer conductive film in this embodiment, the semiconductor device according to an embodiment of the disclosed invention is not limited to this structure. Each of the electrodes 708 and 710 may be formed with plural stacked conductive films. In the case of a two-layer structure, for example, a molybdenum film, a titanium film, a titanium nitride film, or the like may be used as the lower layer, and an aluminum film or the like may be used as the upper layer. In the case of a three-layer structure, a stacked-layer structure of a molybdenum film, an aluminum film, and a molybdenum film, a stacked-layer structure of a titanium film, an aluminum film, and a titanium film, or the like may be used.

Note that a mask used for forming the electrodes 708 and 710 may be formed using a material such as silicon oxide or silicon nitride oxide. In this case, a step of forming a mask by patterning a silicon oxide film, a silicon nitride oxide film, or the like is additionally needed. However, decrease in film thickness of the mask in etching is smaller than that in the case of using a resist material; thus, the electrodes 708 and 710 with more precise shapes can be formed. Alternatively, the electrodes 708 and 710 may be selectively formed by a droplet discharge method without using a mask. Here, a droplet discharge method refers to a method in which droplets containing a predetermined composition are discharged or ejected to form a predetermined pattern, and includes an ink-jet method and the like in its category.

Alternatively, the electrodes 708 and 710 can be formed by etching the conductive film to have desired tapered shapes with an inductively coupled plasma (ICP) etching method with appropriate adjustment of etching conditions (e.g., the amount of electric power applied to a coiled electrode, the amount of electric power applied to a substrate-side electrode, the temperature of the substrate-side electrode, and the like). The tapered shape may be adjusted with the shape of the mask. Note that as an etching gas, a chlorine-based gas such as chlorine, boron chloride, silicon chloride, or carbon tetrachloride, a fluorine-based gas such as carbon tetrafluoride, sulfur fluoride, or nitrogen fluoride, oxygen, or the like can be used as appropriate.

Figure 19A:
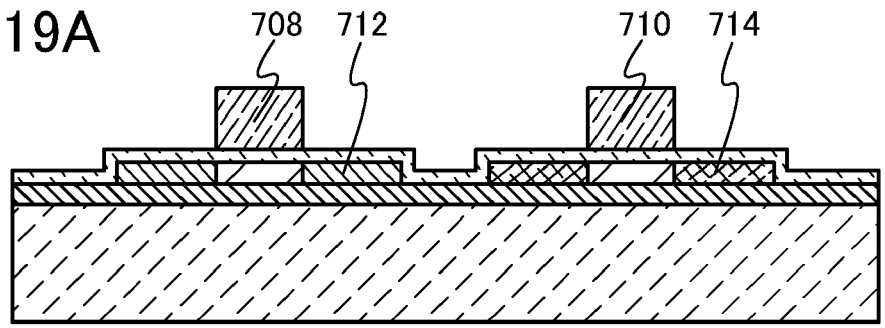
FIGS. 19A to 19D are cross-sectional views illustrating an example of a method for manufacturing a semiconductor device (transistor)

Next, an impurity element imparting one conductivity type is added to the semiconductor layer 702 and the semiconductor layer 704 by using the electrodes 708 and 710 as masks (see FIG. 19A). In this embodiment, an impurity element imparting n-type conductivity (such as phosphorus or arsenic) is added to the semiconductor layer 702, and an impurity element imparting p-type conductivity (such as boron) is added to the semiconductor layer 704. Note that when the impurity element imparting n-type conductivity is added to the semiconductor layer 702, the semiconductor layer 704 to which the p-type impurity element is added is covered with a mask or the like so that the impurity element imparting n-type conductivity is added to the semiconductor layer 702 selectively. When the impurity element imparting p-type conductivity is added to the semiconductor layer 704, the semiconductor layer 702 to which the impurity element imparting n-type conductivity is added is covered with a mask or the like so that the impurity element imparting p-type conductivity is added to the semiconductor layer 704 selectively. Alternatively, after one of the impurity element imparting p-type conductivity and the impurity element imparting n-type conductivity is added to the semiconductor layers 702 and 704, the other of the impurity element imparting p-type conductivity and the impurity element imparting n-type conductivity may be added to only one of the semiconductor layers at a higher concentration. By the addition of the impurity elements, impurity regions 712 and impurity regions 714 are formed in the semiconductor layer 702 and the semiconductor layer 704, respectively.

Figure 19B:
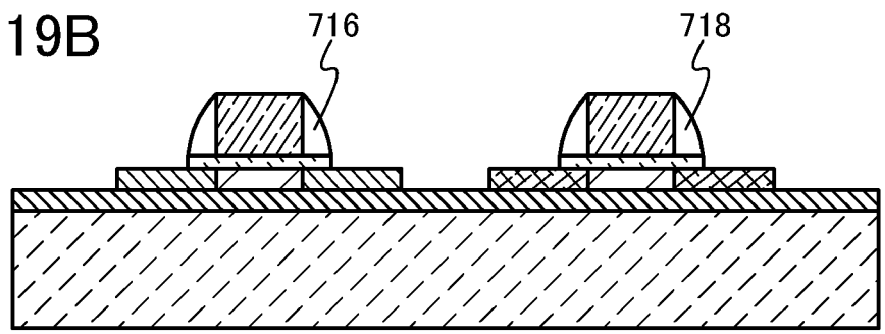

Next, sidewalls 716 are formed on side surfaces of the electrode 708, and sidewalls 718 are formed on side surfaces of the electrode 710 (see FIG. 19B). The sidewalls 716 and 718 can be formed by, for example, newly forming an insulating film so as to cover the gate insulating film 706 and the electrodes 708 and 710 and partly etching the newly formed insulating film with anisotropic etching. Note that the gate insulating film 706 may also be etched partly with the anisotropic etching. For the insulating film used for forming the sidewalls 716 and 718, a film containing silicon, silicon oxide, silicon nitride, silicon oxynitride, silicon nitride oxide, an organic material, or the like may be formed to have a single layer structure or a stacked-layer structure by a plasma CVD method, a sputtering method, or the like. In this embodiment, a 100-nm-thick silicon oxide film is formed by a plasma CVD method. In addition, as an etching gas, a mixed gas of $CHF_3$ and helium can be used. Note that the steps of forming the sidewalls 716 and 718 are not limited to the steps described here.

Figure 19C:
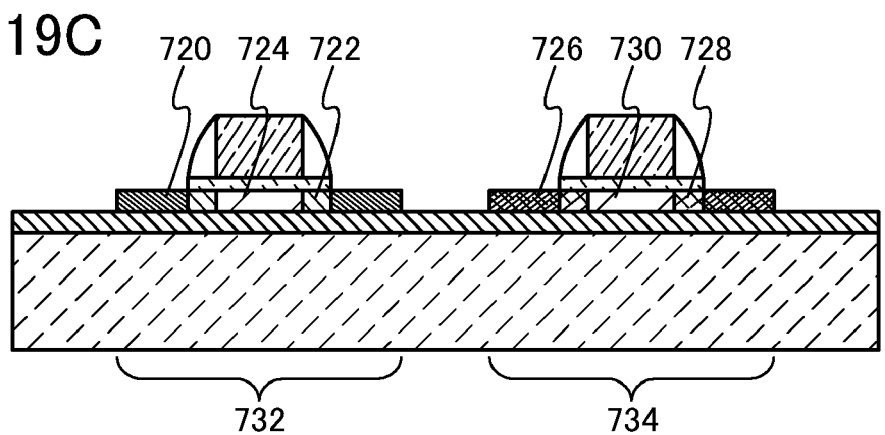

Next, impurity elements each imparting one conductivity type are added to the semiconductor layers 702 and 704 using the gate insulating film 706, the electrodes 708 and 710, and the sidewalls 716 and 718 as masks (see FIG. 19C). Note that the impurity elements imparting the same conductivity types as the impurity elements which are added to the semiconductor layers 702 and 704 in the previous step are added to the semiconductor layers 702 and 704 at higher concentrations. Here, when the impurity element imparting n-type conductivity is added to the semiconductor layer 702, the semiconductor layer 704 to which the p-type impurity element is added is covered with a mask or the like so that the impurity element imparting n-type conductivity is added to the semiconductor layer 702 selectively. When the impurity element imparting p-type conductivity is added to the semiconductor layer 704, the semiconductor layer 702 to which the impurity element imparting n-type conductivity is added is covered with a mask or the like so that the impurity element imparting p-type conductivity is added to the semiconductor layer 704 selectively.

By the addition of the impurity element, a pair of high-concentration impurity regions 720, a pair of low-concentration impurity regions 722, and a channel formation region 724 are formed in the semiconductor layer 702. In addition, by the addition of the impurity element, a pair of high-concentration impurity regions 726, a pair of low-concentration impurity regions 728, and a channel formation region 730 are formed in the semiconductor layer 704. The high-concentration impurity regions 720 and the high-concentration impurity regions 726 each function as a source or a drain, and the low-concentration impurity regions 722 and the low-concentration impurity regions 728 each function as a lightly doped drain (LDD) region.

Note that the sidewalls 716 formed over the semiconductor layer 702 and the sidewalls 718 formed over the semiconductor layer 704 may be formed so as to have the same length or different lengths in a direction in which carriers travel (in a direction parallel to a so-called channel length). For example, each of the sidewalls 718 over the semiconductor layer 704 which constitutes part of a p-channel transistor is preferably formed to have a longer length in the direction in which carriers travel than that of each of the sidewalls 716 over the semiconductor layer 702 which constitutes part of an n-channel transistor. By increasing the lengths of the sidewalls 718 of the p-channel transistor, a short channel effect due to diffusion of boron can be suppressed; therefore, boron can be added to the source and the drain at high concentration. Accordingly, the resistance of the source and the drain can be reduced.

In order to further reduce the resistance of the source and the drain, a silicide region may be formed by forming silicide in part of the semiconductor layers 702 and 704. The silicide is formed by placing a metal in contact with the semiconductor layers and causing a reaction between the metal and silicon in the semiconductor layers by heat treatment (e.g., a GRTA method, an LRTA method, or the like). For the silicide region, cobalt silicide, nickel silicide, or the like may be used. In the case where the semiconductor layers 702 and 704 are thin, silicide reaction may proceed to the bottoms of the semiconductor layers 702 and 704. As a metal used for the siliciding, the following can be used: titanium (Ti), nickel (Ni), tungsten (W), molybdenum (Mo), cobalt (Co), zirconium (Zr), hafnium (Hf), tantalum (Ta), vanadium (V), neodymium (Nd), chromium (Cr), platinum (Pt), palladium (Pd), or the like. Further, a silicide region can also be formed by laser light irradiation or the like.

Through the above steps, an n-channel transistor 732 and a p-channel transistor 734 are formed. Note that although conductive films each serving as a source electrode or a drain electrode have not been formed at the stage in FIG. 19C, a structure including these conductive films each serving as a source electrode or a drain electrode may also be referred to as a transistor.

Figure 19D:
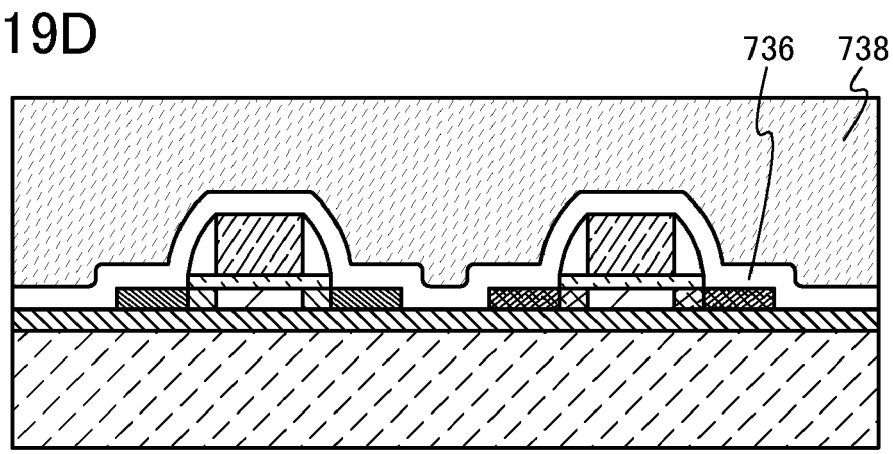

Next, an insulating film 736 is formed so as to cover the n-channel transistor 732 and the p-channel transistor 734 (see FIG. 19D). The insulating film 736 is not always necessary; however, the formation of the insulating film 736 can prevent impurities such as an alkali metal and an alkaline earth metal from penetrating the n-channel transistor 732 and the p-channel transistor 734. Specifically, the insulating film 736 is desirably formed using a material such as silicon oxide, silicon nitride, silicon oxynitride, silicon nitride oxide, aluminum nitride, or aluminum oxide. In this embodiment, a silicon nitride oxide film with a thickness of approximately 600 nm is used as the insulating film 736. In this case, the hydrogenation step may be performed after the silicon nitride oxide film is formed. Note that although the insulating film 736 is formed to have a single-layer structure in this embodiment, it is needless to say that the insulating film 736 may have a stacked-layer structure. For example, in the case of a two-layer structure, the insulating film 736 may have a stacked-layer structure of a silicon oxynitride film and a silicon nitride oxide film.

Next, an insulating film 738 is formed over the insulating film 736 so as to cover the n-channel transistor 732 and the p-channel transistor 734. The insulating film 738 may be formed using an organic material having heat resistance, such as a polyimide, an acrylic resin, a benzocyclobutene-based resin, a polyamide, or an epoxy resin. Other than such an organic material, it is also possible to use a low-dielectric constant material (a low-k material), a siloxane-based resin, silicon oxide, silicon nitride, silicon oxynitride, silicon nitride oxide, phosphosilicate glass (PSG), borophosphosilicate glass (BPSG), alumina, or the like. Here, the siloxane-based resin corresponds to a resin including a Si—O—Si bond which is formed using a siloxane-based material as a starting material. The siloxane-based resin may include, besides hydrogen, at least one of fluorine, an alkyl group, and aromatic hydrocarbon as a substituent. Alternatively, the insulating film 738 may be formed by stacking plural insulating films using any of these materials.

For the formation of the insulating film 738, the following method can be employed depending on the material of the insulating film 738: a CVD method, a sputtering method, an SOG method, a spin coating method, a dipping method, a spray coating method, a droplet discharge method (e.g., an ink-jet method, screen printing, offset printing, or the like), a doctor knife, a roll coater, a curtain coater, a knife coater, or the like.

Next, contact holes are formed in the insulating films 736 and 738 so that each of the semiconductor layers 702 and 704 is partly exposed. Then, conductive films 740 and 742 are formed in contact with the semiconductor layer 702 through the contact holes, and conductive films 744 and 746 are formed in contact with the semiconductor layer 704 through the contact holes (see FIG. 20A). The conductive films 740, 742, 744, and 746 serve as source electrodes and drain electrodes of the transistors. Note that in this embodiment, as an etching gas used for forming the contact holes, a mixed gas of $CHF_3$ and He is used; however, the etching gas is not limited thereto.

The conductive films 740, 742, 744, and 746 can be formed by a CVD method, a sputtering method, or the like. As the material, aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), silicon (Si), or the like can be used. Alternatively, an alloy containing any of the above materials as its main component or a compound containing any of the above materials may be used. The conductive films 740, 742, 744, and 746 may each have a single-layer structure or a stacked-layer structure.

As examples of an alloy containing aluminum as its main component, an alloy containing aluminum as its main component and also containing nickel, and an alloy containing aluminum as its main component and also containing nickel and one or both of elements carbon and silicon can be given. Because aluminum and aluminum silicon (Al—Si) have low resistance and are inexpensive, aluminum and aluminum silicon are suitable as a material for forming the conductive films 740, 742, 744, and 746. In particular, aluminum silicon is preferable because generation of a hillock due to resist baking at the time of patterning can be suppressed. Further, a material in which Cu is mixed into aluminum at approximately 0.5% may be used instead of silicon.

In the case where each of the conductive films 740, 742, 744, and 746 is formed to have a stacked-layer structure, a stacked-layer structure of a barrier film, an aluminum silicon film, and a barrier film, a stacked-layer structure of a barrier film, an aluminum silicon film, a titanium nitride film, and a barrier film, or the like may be employed, for example. Note that a barrier film refers to a film formed using titanium, a nitride of titanium, molybdenum, a nitride of molybdenum, or the like. By forming the conductive films such that an aluminum silicon film is interposed between barrier films, generation of hillocks of aluminum or aluminum silicon can be further prevented. Moreover, by forming the barrier film using titanium that is a highly reducible element, even if a thin oxide film is formed on the semiconductor layers 702 and 704, the oxide film is reduced by the titanium contained in the barrier film, whereby favorable contact can be obtained between the semiconductor layer 702 and the conductive films 740 and 742 and between the semiconductor layer 704 and the conductive films 744 and 746. Further, it is also possible to stack a plurality of barrier films. In that case, for example, each of the conductive films 740, 742, 744, and 746 can be formed to have a five-layer structure of titanium, titanium nitride, aluminum silicon, titanium, and titanium nitride in order from the bottom or a stacked-layer structure of more than five layers.

For the conductive films 740, 742, 744, and 746, tungsten silicide formed by a chemical vapor deposition method using a $WF_6$ gas and a $SiH_4$ gas may be used. Alternatively, tungsten formed by hydrogenation of $WF_6$ may be used for the conductive films 740, 742, 744, and 746.

Note that the conductive films 740 and 742 are connected to the high-concentration impurity regions 720 of the n-channel transistor 732. The conductive films 744 and 746 are connected to the high-concentration impurity regions 726 of the p-channel transistor 734.

Figure 20A:
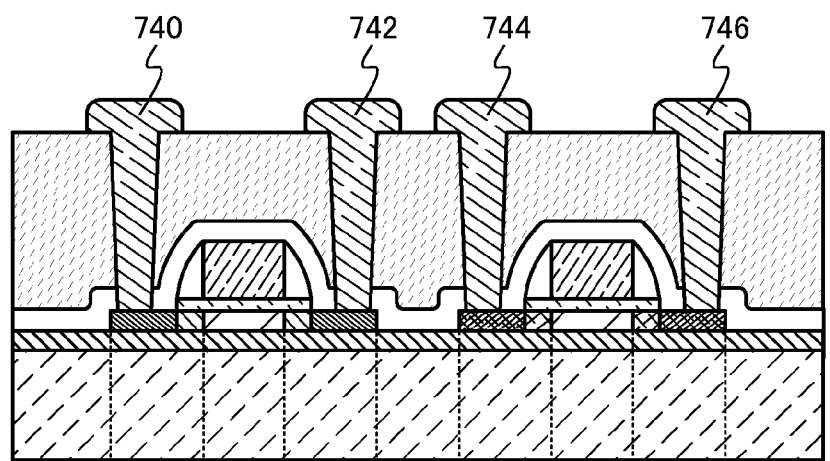
FIGS. 20A and 20B are a plan view of a semiconductor device (transistor) and a cross-sectional view thereof, respectively.
Figure 20B:
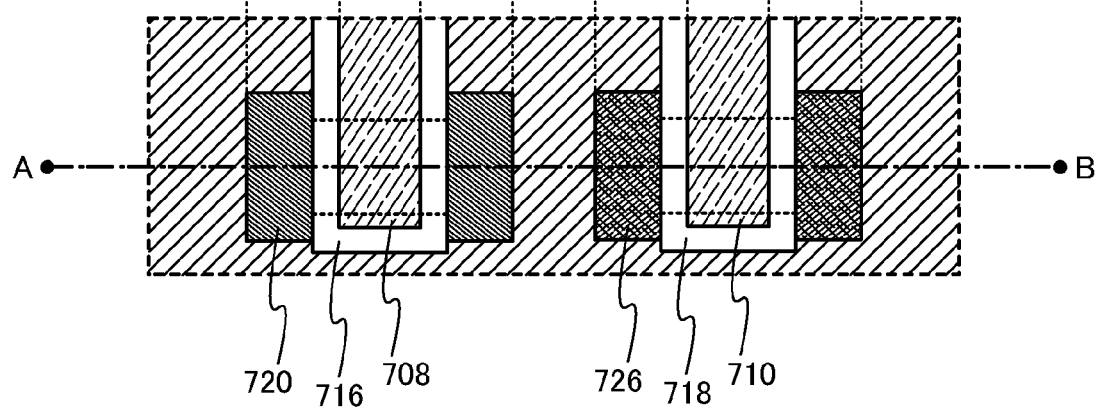

FIG. 20B is a plan view of the n-channel transistor 732 and the p-channel transistor 734 which are illustrated in FIG. 20A. Here, a cross-sectional view taken along line A-B in FIG. 20B corresponds to FIG. 20A. Note that in FIG. 20B, the conductive films 740, 742, 744, and 746, the insulating films 736 and 738, and the like are omitted for simplicity.

Note that although the case where the n-channel transistor 732 and the p-channel transistor 734 each include one electrode serving as a gate electrode (the case where the n-channel transistor 732 and the p-channel transistor 734 include the electrodes 708 and 710) is described in this embodiment as an example, an embodiment of the disclosed invention is not limited to this structure. The transistors may have a multi-gate structure in which a plurality of electrodes serving as gate electrodes is included and electrically connected to one another.

In this embodiment, an SOI substrate having an excellent semiconductor layer where generation of the surface roughness is suppressed is used; therefore, the manufacturing yield of semiconductor devices can be improved. Note that the structure described in this embodiment can be used in appropriate combination with any of structures described in the other embodiments.

Example 1

In this example, effects of the methods described in any of the above embodiments were confirmed. The results were described with reference to drawings.

Samples were each prepared by providing over a glass substrate a silicon layer separated from a single crystal silicon substrate (laser light irradiation was not performed). Specifically, the following three kinds of samples were prepared: a sample (sample A) obtained without forming a closed region; a sample (sample B) obtained by damaging (forming a projected and recessed portion) a glass substrate with a glass pen to form a closed region; and a sample (sample C) obtained by damaging (forming a projected and recessed portion) a glass substrate by laser light irradiation to form a closed region. Details of the methods for forming the samples are similar to those in Embodiment 2 or the like. Note that in this example, a surface of a silicon layer was subjected to etching treatment after separation of the silicon layer. Then, the surface of the silicon layer was irradiated with laser light. The sample A can be formed without forming a projected and recessed portion.

Figure 21A:
FIGS. 21A and 21B are views showing a surface of a silicon layer.
Figure 21B:
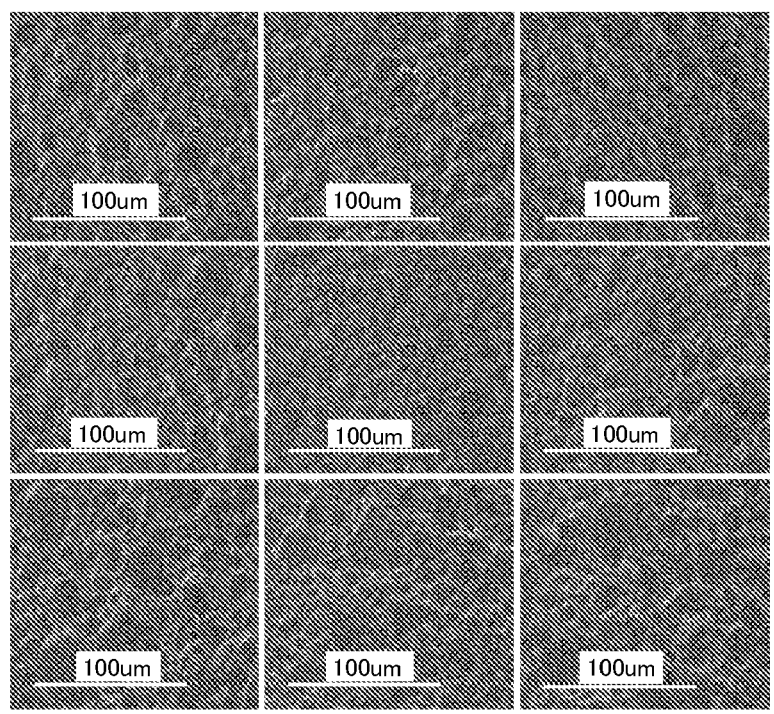
Figure 22A:
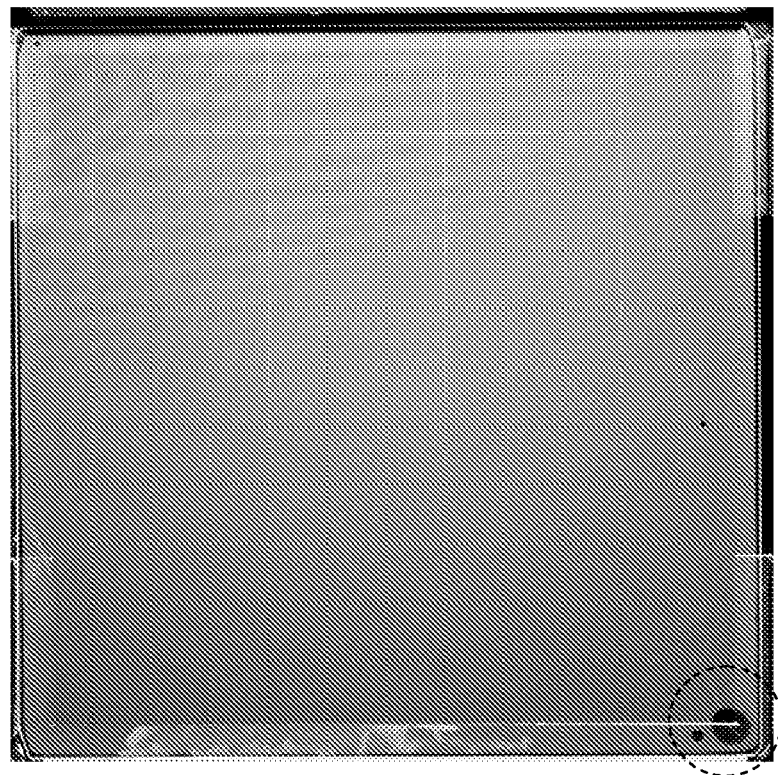
FIGS. 22A and 22B are views showing a surface of a silicon layer.
Figure 22B:
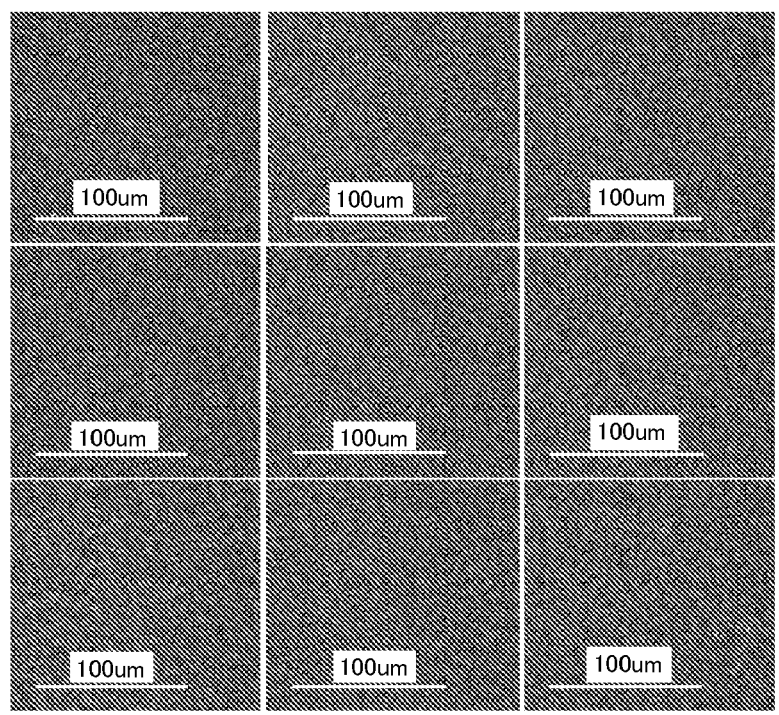
Figure 23A:
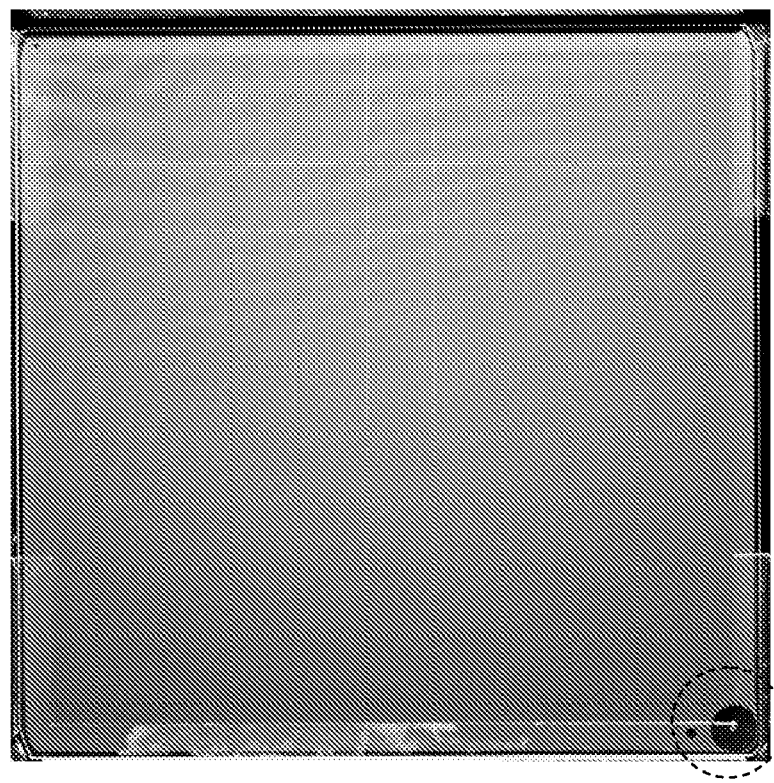
FIGS. 23A and 23B are views showing a surface of a silicon layer.
Figure 23B:
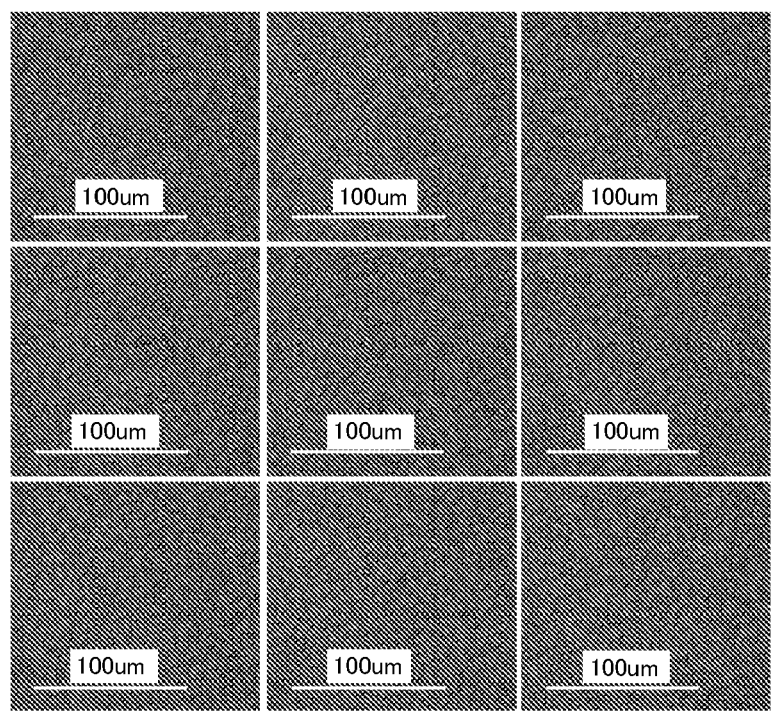
Figure 24A:
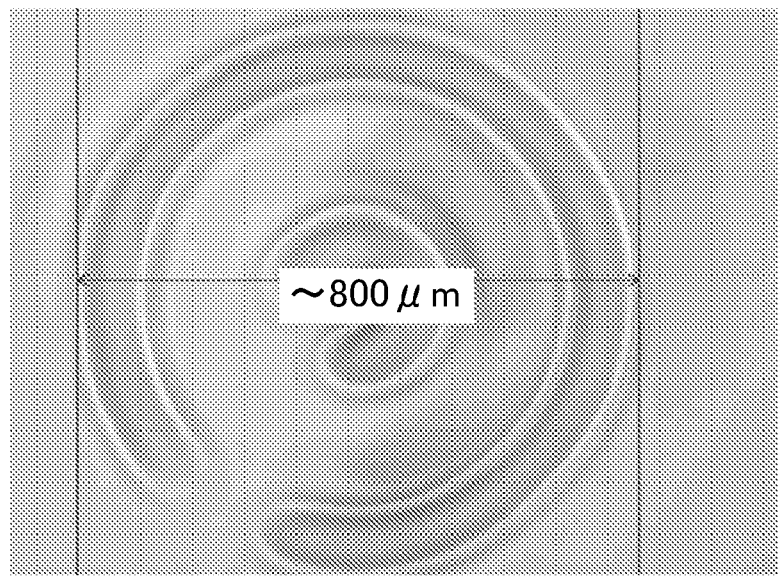
FIGS. 24A and 24B are a view showing an example of a surface of a glass substrate and a graph thereof, respectively.
Figure 24B:
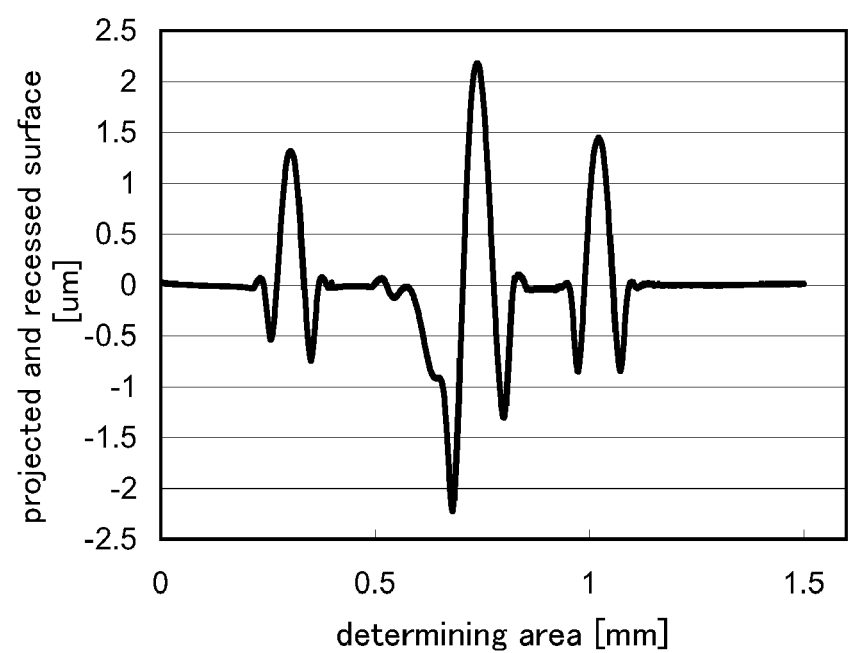

FIGS. 21A and 21B, FIGS. 22A and 22B, and FIGS. 23A and 23B each show the surface of the silicon layer shortly after forming over a glass substrate the silicon layer separated from a single crystal silicon substrate. FIGS. 21A and 21B each show the sample A, FIGS. 22A and 22B each show the sample B, and FIGS. 23A and 23B each show the sample C. Note that FIG. 21B, FIG. 22B, and FIG. 23B are enlarged photographs (photomicrographs) of parts of FIG. 21A, FIG. 22A, and FIG. 23A, respectively. In addition, FIGS. 24A and 24B each show an example of the surface of the glass substrate damaged by laser light irradiation. Note that in FIGS. 24A and 24B, the size of the damage was approximately 800 µm (0.8 mm) in diameter.

As for each of the sample B and the sample C, a closed region is formed at a bottom-right portion in each drawing (a corner: an area surrounded by a dotted circle in each drawing) (see FIG. 22A and FIG. 23A). Bonding of the glass substrate and the single crystal silicon substrate proceeded from the portion (the corner). Note that a certain advantageous effect was obtained even when bonding proceeds from a portion other than the portion (the corner); however, when bonding proceeded from the portion (the corner), the largest effect was obtained.

From FIG. 21B, FIG. 22B, and FIG. 23B, it is found that surface roughness of the silicon layers of the samples each having a closed region (the sample B and the sample C) is reduced as compared to the sample without a closed region (the sample A).

Figures 25A, 25B:
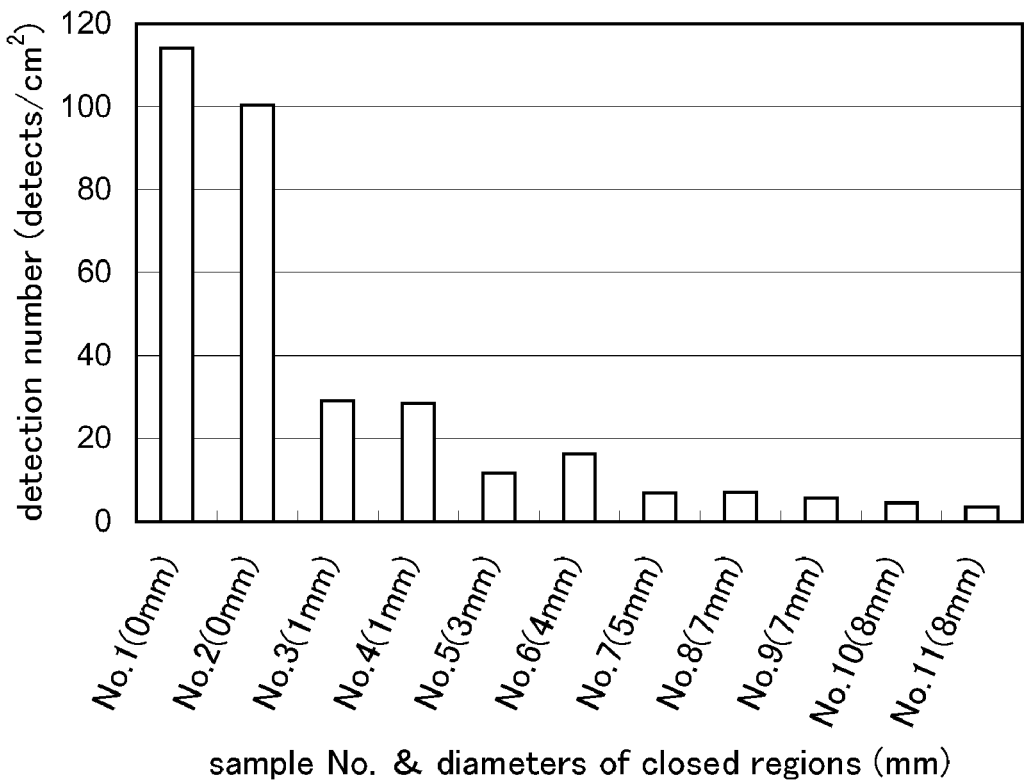
FIGS. 25A and 25B are a graph showing the relation between diameters of a closed region and the number of defects and a table thereof, respectively.

FIGS. 25A and 25B show the relation between diameters of closed regions and the number (detection number) of defects in a silicon layer. Here, the detection number refers to the number of defects each having a size of 1 µm or longer in diameter, which were detected by a pattern detector. Note that the pattern detector is equipment to which an optical microscope and image analysis are applied.

From FIGS. 25A and 25B, it is found that as the diameter of the closed region increases, the detection number of defects is reduced. Even when the closed region is very small (for example, when the diameter of the closed region is 1 mm), the detection number is significantly small as compared to the case where the closed region is not formed (the case where the diameter of the closed region is 0 mm). These results lead to a conclusion that formation of the closed region is extremely effective at suppressing the formation of defects in the silicon layer.

Figure 26A:
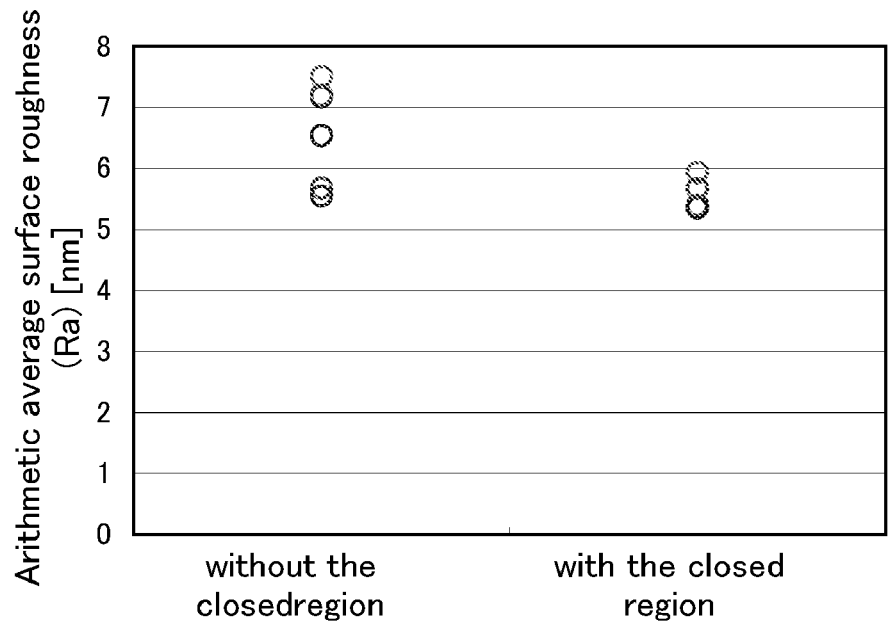
FIGS. 26A and 26B are graphs showing results obtained by comparing surface roughness.
Figure 26B:
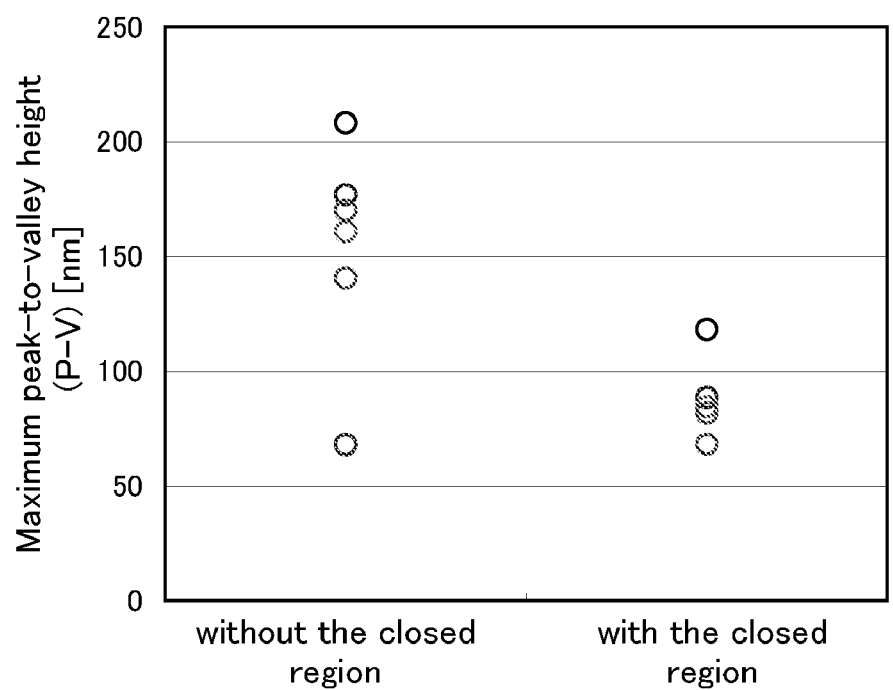
Figure 27:
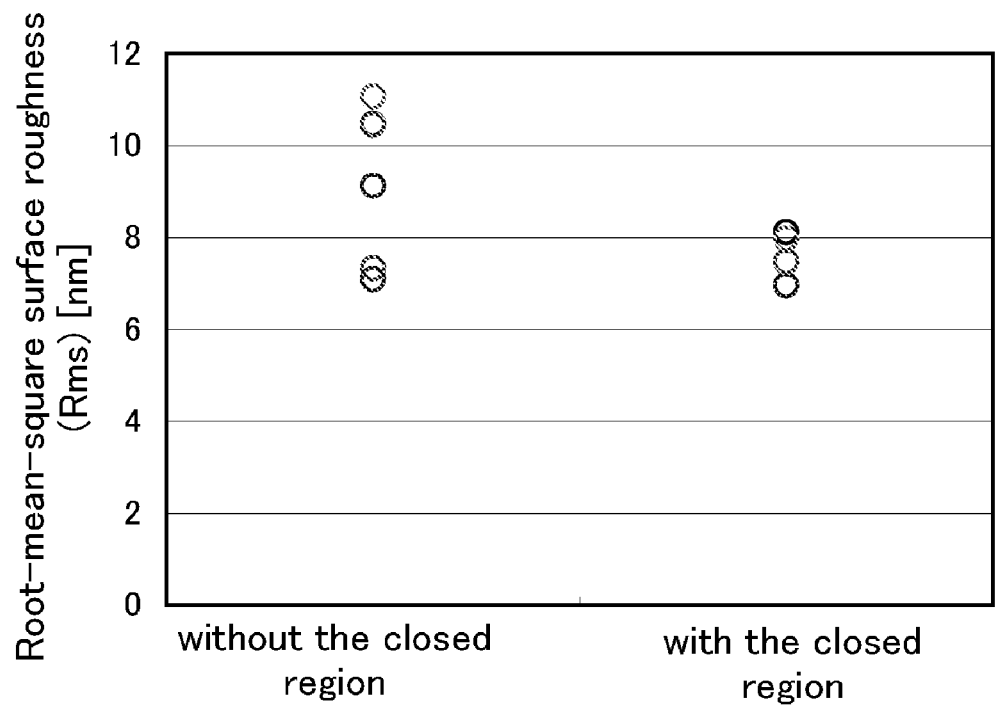
FIG. 27 is a graph showing results obtained by comparing surface roughness.

FIGS. 26A and 26B and FIG. 27 show results obtained by comparing roughness on the surface of the sample without the closed region and roughness on the surface of the sample having the closed region. FIG. 26A shows an arithmetic average surface roughness ($R_a$) and FIG. 26B shows the maximum peak-to-valley height (P-V). FIG. 27 shows a root-mean-square surface roughness ($R_{ms}$).

From FIG. 26A, it is found that $R_a$ of the sample without the closed region is more than 7.0 nm whereas $R_a$ of the sample having the closed region is 6.0 nm or less. Further, from FIG. 26B, it is found that P-V of the sample without the closed region is more than 150 nm whereas P-V of the sample having the closed region is 150 nm or less. Furthermore, from FIG. 27, it is found that $R_{ms}$ of the sample without the closed region is more than 10 nm whereas $R_{ms}$ of the sample having the closed region is 10 nm or less.

As described above, this example reveals effectiveness of an embodiment of the disclosed invention. Specifically, in this example, the number density of defects of a semiconductor layer can be reduced to 5 defects/cm² or less. Note that according to an embodiment of the disclosed invention, the number of defects of a semiconductor layer can be sufficiently reduced; therefore, it is possible to suppress an increase in the number and size of defects even in the case where laser light irradiation is performed in a later step. Thus, an embodiment of the disclosed invention is extremely effective when used in combination with laser light irradiation.

Example 2

In this example, effects of a modified example were confirmed. The results were described with reference to drawings.

The following samples were prepared: a sample (one sample) obtained without forming a closed region; and samples (two samples) obtained by damaging (forming projected and recessed portions) glass substrates by laser light irradiation to each form a closed region. Details of the methods for forming the samples are similar to those in Embodiment 2 or the like. Note that in this example, surfaces of silicon layers were subjected to laser light irradiation without being subjected to etching treatment after separation of the silicon layers.

Figures 28A, 28B:
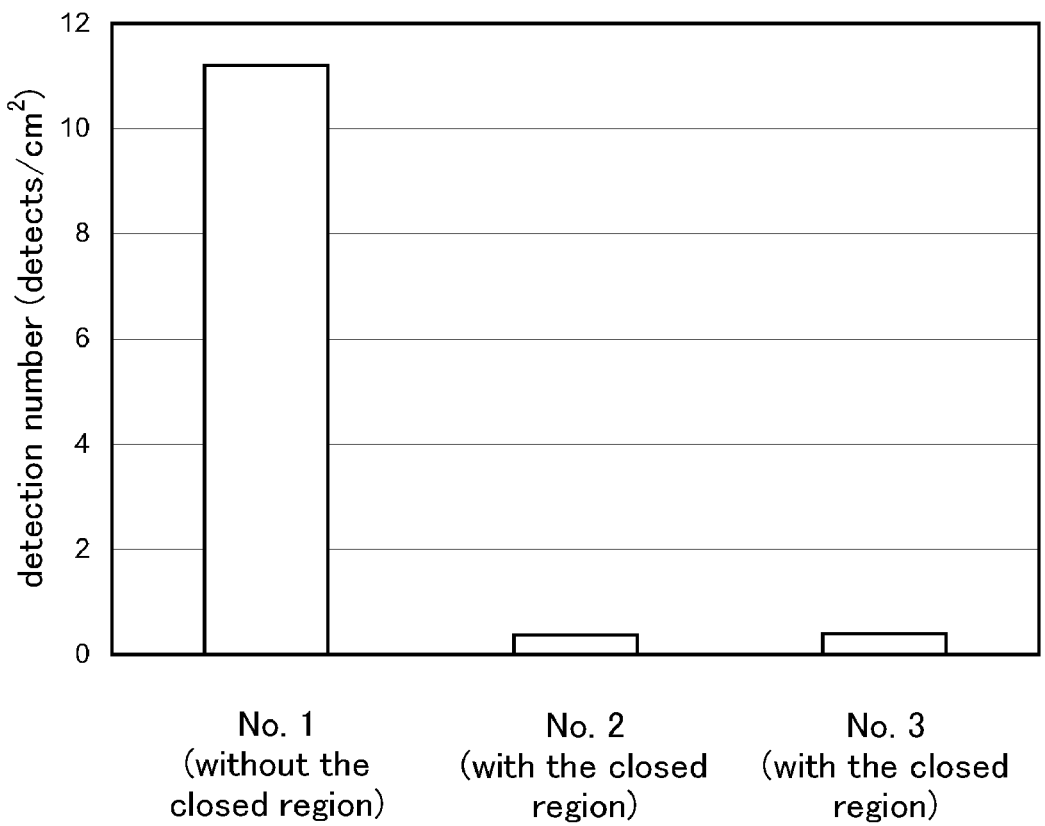
FIGS. 28A and 28B are a graph showing difference in the number of defects depending on whether or not a closed region exists and a table thereof, respectively.

FIGS. 28A and 28B show the number of defects of silicon layers of the samples. In this example, the detection number refers to the number of defects each having a size of 1 µm or longer in diameter, which were detected by a pattern detector. Note that the pattern detector is equipment to which an optical microscope and image analysis are applied.

From FIGS. 28A and 28B, it is found that the detection number of defects is extremely reduced in the case of the samples each having the closed region. These results lead to a conclusion that formation of the closed region is extremely effective at suppressing the formation of defects in the silicon layer.

Note that in this example, the surface of the silicon layer was subjected to laser light irradiation without being subjected to etching treatment; thus, the thick silicon layer was subjected to laser light irradiation as compared to the case where the surface of the silicon layer was subjected to laser light irradiation after being subjected to etching treatment. Therefore, it is possible to further reduce the number of defects. Specifically, in this example, the number density of defects of a semiconductor layer can be reduced to 1 defect/cm² or less. Thus, an embodiment of the disclosed invention is extremely effective when used in combination with laser light irradiation.

This application is based on Japanese Patent Application serial no. 2009-152598 filed with Japan Patent Office on Jun. 26, 2009, the entire contents of which are hereby incorporated by reference.

What is claimed is:

1. A method for manufacturing an SOI substrate, comprising the steps of:
    forming an embrittled region in a single crystal semiconductor substrate by irradiating the single crystal semiconductor substrate with an accelerated ion;
    forming a first insulating layer over one of a surface of the single crystal semiconductor substrate and a surface of a base substrate;
    bonding the single crystal semiconductor substrate and the base substrate to each other with the first insulating layer interposed therebetween so as to form a space in which the single crystal semiconductor substrate and the base substrate are not bonded to each other; and
    separating the single crystal semiconductor substrate from the base substrate at the embrittled region by heat treatment, leaving a single crystal semiconductor layer between the surface of the single crystal semiconductor substrate and the embrittled region over the base substrate;

wherein a stress is generated through the heat treatment, in proximity of the space in the single crystal semiconductor substrate in order that separation of the single crystal semiconductor substrate is promoted.

2. The method for manufacturing an SOI substrate according to claim 1, further comprising the step of forming a second insulating layer over the other of the surface of the single crystal semiconductor substrate and the surface of the base substrate.

3. The method for manufacturing an SOI substrate according to claim 1, further comprising the step of forming a region including a projected portion or a recessed portion at the single crystal semiconductor substrate, the base substrate or the first insulating layer before the step of bonding.

4. The method for manufacturing an SOI substrate according to claim 3, wherein an area of the region is 1.0 mm$^2$ or more.

5. The method for manufacturing an SOI substrate according to claim 3, wherein the region is formed in a corner of the single crystal semiconductor substrate.

6. The method for manufacturing an SOI substrate according to claim 1, further comprising the step of forming a region including a projected portion and a recessed portion at the single crystal semiconductor substrate, the base substrate or the first insulating layer before the step of bonding.

7. The method for manufacturing an SOI substrate according to claim 6, wherein an area of the region is 1.0 mm$^2$ or more.

8. The method for manufacturing an SOI substrate according to claim 6, wherein the region is formed in a corner of the single crystal semiconductor substrate.

9. The method for manufacturing an SOI substrate according to claim 1, wherein bonding of the single crystal semiconductor substrate and the base substrate proceeds from a corner of the single crystal semiconductor substrate.

10. The method for manufacturing an SOI substrate according to claim 1, wherein the single crystal semiconductor layer is subjected to laser light irradiation treatment.

11. The method for manufacturing an SOI substrate according to claim 1, wherein a temperature of the heat treatment is 500° C. or lower.

12. The method for manufacturing an SOI substrate according to claim 1, wherein a number density of defects of the single crystal semiconductor layer is 1 defect/cm$^2$ or less.

13. A method for manufacturing an SOI substrate, comprising the steps of:
forming an embrittled region in a bond substrate by irradiating the bond substrate with an accelerated ion;
forming an insulating layer over one of a surface of the bond substrate and a surface of a base substrate;
bonding the bond substrate and the base substrate to each other with the insulating layer interposed therebetween so as to form a space in which the bond substrate and the base substrate are not bonded to each other; and
separating the bond substrate from the base substrate at the embrittled region by heat treatment, leaving a semiconductor layer between the surface of the bond substrate and the embrittled region over the base substrate,
wherein a stress is generated through the heat treatment, in proximity of the space in the bond substrate in order that separation of the bond substrate is promoted.

14. The method for manufacturing an SOI substrate according to claim 13, further comprising the step of forming a region including a projected portion or a recessed portion at the bond substrate, the base substrate or the insulating layer before the step of bonding.

15. The method for manufacturing an SOI substrate according to claim 14, wherein an area of the region is 1.0 mm$^2$ or more.

16. The method for manufacturing an SOI substrate according to claim 14, wherein the region is formed in a corner of the bond substrate.

17. The method for manufacturing an SOI substrate according to claim 13, further comprising the step of forming a region including a projected portion and a recessed portion at the bond substrate, the base substrate or the insulating layer before the step of bonding.

18. The method for manufacturing an SOI substrate according to claim 17, wherein an area of the region is 1.0 mm$^2$ or more.

19. The method for manufacturing an SOI substrate according to claim 17, wherein the region is formed in a corner of the bond substrate.

20. The method for manufacturing an SOI substrate according to claim 13, wherein bonding of the bond substrate and the base substrate proceeds from a corner of the bond substrate.

21. The method for manufacturing an SOI substrate according to claim 13, wherein the semiconductor layer is subjected to laser light irradiation treatment.

22. The method for manufacturing an SOI substrate according to claim 13, wherein a temperature of the heat treatment is 500° C. or lower.

23. The method for manufacturing an SOI substrate according to claim 13, wherein a number density of defects of the semiconductor layer is 1 defect/cm$^2$ or less.

24. A method for manufacturing an SOI substrate, comprising the steps of:
forming an embrittled region in a bond substrate by irradiating the bond substrate with an accelerated ion;
forming a first insulating layer over one of a surface of the bond substrate and a surface of a base substrate;
forming a region including a projected portion at the bond substrate, the base substrate or the first insulating layer before the step of bonding;
bonding the bond substrate and the base substrate to each other with the first insulating layer interposed therebetween so as to form a space in which the bond substrate and the base substrate are not bonded to each other, due to the region including the projected portion; and
separating the bond substrate from the base substrate at the embrittled region by heat treatment, leaving a semiconductor layer between the surface of the bond substrate and the embrittled region over the base substrate,
wherein a stress is generated through the heat treatment, in proximity of the space in the bond substrate in order that separation of the bond substrate is promoted.

25. The method for manufacturing an SOI substrate according to claim 24, further comprising the step of forming a second insulating layer over the other of the surface of the bond substrate and the surface of the base substrate.

26. The method for manufacturing an SOI substrate according to claim 24, wherein the region further includes a recessed portion.

27. The method for manufacturing an SOI substrate according to claim 24, wherein an area of the region is 1.0 mm$^2$ or more.

28. The method for manufacturing an SOI substrate according to claim 24, wherein the region is formed in a corner of the bond substrate.

29. The method for manufacturing an SOI substrate according to claim 24, wherein bonding of the bond substrate and the base substrate proceeds from a corner of the bond substrate.

30. The method for manufacturing an SOI substrate according to claim 24, wherein the semiconductor layer is subjected to laser light irradiation treatment.

31. The method for manufacturing an SOI substrate according to claim 24, wherein a temperature of the heat treatment is 500° C. or lower.

32. The method for manufacturing an SOI substrate according to claim 24, wherein a number density of defects of the semiconductor layer is 1 defect/cm$^2$ or less.

33. A method for manufacturing an SOI substrate, comprising the steps of:
  forming an embrittled region in a bond substrate by irradiating the bond substrate with an accelerated ion;
  forming a first insulating layer over one of a surface of the bond substrate and a surface of a base substrate;
  forming a region including a recessed portion at the bond substrate, the base substrate or the first insulating layer before the step of bonding;
  bonding the bond substrate and the base substrate to each other with the first insulating layer interposed therebetween so as to form a space in which the bond substrate and the base substrate are not bonded to each other, due to the region including the recessed portion; and
  separating the bond substrate from the base substrate at the embrittled region by heat treatment, leaving a semiconductor layer between the surface of the bond substrate and the embrittled region over the base substrate,
  wherein a stress is generated through the heat treatment, in proximity of the space in the bond substrate in order that separation of the bond substrate is promoted.

34. The method for manufacturing an SOI substrate according to claim 33, further comprising the step of forming a second insulating layer over the other of the surface of the bond substrate and the surface of the base substrate.

35. The method for manufacturing an SOI substrate according to claim 33, wherein an area of the region is 1.0 mm$^2$ or more.

36. The method for manufacturing an SOI substrate according to claim 33, wherein the region is formed in a corner of the bond substrate.

37. The method for manufacturing an SOI substrate according to claim 33, wherein bonding of the bond substrate and the base substrate proceeds from a corner of the bond substrate.

38. The method for manufacturing an SOI substrate according to claim 33, wherein the semiconductor layer is subjected to laser light irradiation treatment.

39. The method for manufacturing an SOI substrate according to claim 33, wherein a temperature of the heat treatment is 500° C. or lower.

40. The method for manufacturing an SOI substrate according to claim 33, wherein a number density of defects of the semiconductor layer is 1 defect/cm$^2$ or less.

* * * * *